(12) United States Patent
Kwon

(10) Patent No.: US 11,735,571 B2
(45) Date of Patent: Aug. 22, 2023

(54) SEMICONDUCTOR PACKAGE INCLUDING A REDISTRIBUTION STRUCTURE

(71) Applicant: SAMSUNG ELECTRONICS CO., LTD., Suwon-si (KR)

(72) Inventor: Yonghwan Kwon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 172 days.

(21) Appl. No.: 17/321,906

(22) Filed: May 17, 2021

(65) Prior Publication Data

US 2022/0068896 A1 Mar. 3, 2022

(30) Foreign Application Priority Data

Aug. 26, 2020 (KR) ........................ 10-2020-0107797

(51) Int. Cl.
*H01L 23/495* (2006.01)
*H01L 25/10* (2006.01)
*H01L 23/538* (2006.01)
*H01L 23/498* (2006.01)

(52) U.S. Cl.
CPC ...... *H01L 25/105* (2013.01); *H01L 23/49838* (2013.01); *H01L 23/5383* (2013.01); *H01L 23/5389* (2013.01); *H01L 2225/1023* (2013.01); *H01L 2225/1041* (2013.01); *H01L 2225/1058* (2013.01)

(58) Field of Classification Search
CPC ........... H01L 23/49838; H01L 23/5383; H01L 23/5389; H01L 2225/1041; H01L 2224/0233; H01L 2224/02331

USPC ........................................................ 267/668
See application file for complete search history.

(56) References Cited

U.S. PATENT DOCUMENTS

| | | | |
|---|---|---|---|
| 8,786,081 B2 | 7/2014 | Chen | |
| 8,884,431 B2 | 11/2014 | Lin et al. | |
| 9,397,058 B2 | 7/2016 | Bao et al. | |
| 9,716,071 B2* | 7/2017 | Ryu | ........................ H01L 24/05 |
| 9,741,659 B2 | 8/2017 | Chen et al. | |
| 10,008,462 B2 | 6/2018 | Seo et al. | |
| 10,224,287 B2 | 3/2019 | Syu et al. | |
| 10,297,560 B2 | 5/2019 | Yu et al. | |
| 10,510,723 B2 | 12/2019 | Lu et al. | |
| 10,522,471 B2* | 12/2019 | Suk | ........................ H01L 25/105 |
| 10,535,521 B2 | 1/2020 | Hunt et al. | |
| 11,018,025 B2* | 5/2021 | Chen | .................. H01L 23/5226 |
| 2013/0280826 A1* | 10/2013 | Scanlan | .................. H01L 24/03 438/15 |

(Continued)

*Primary Examiner* — Nitin Parekh
(74) *Attorney, Agent, or Firm* — F. Chau & Associates, LLC

(57) ABSTRACT

A semiconductor package includes: a first wiring pattern; a dielectric layer that covers the first wiring pattern; a second wiring pattern on the dielectric layer, wherein the second wiring pattern includes a line part that extends in a first direction and a via part that connects the line part to the first wiring pattern; a pad pattern electrically connected to the second wiring pattern, wherein the pad pattern includes a connection part and an extension part, wherein the connection part covers a first surface of the line part of the second wiring pattern, and the extension part has a top surface at a level lower than a level of the top surface of the line part of the second wiring pattern; and a seed pattern between the extension part and the dielectric layer.

20 Claims, 27 Drawing Sheets

(56) References Cited

U.S. PATENT DOCUMENTS

| | | | |
|---|---|---|---|
| 2015/0115454 A1* | 4/2015 | Magnus | H01L 24/19 |
| | | | 257/773 |
| 2018/0047571 A1* | 2/2018 | Hunt | H01L 23/16 |
| 2019/0363064 A1* | 11/2019 | Lu | H01L 21/4846 |
| 2019/0371734 A1* | 12/2019 | Chang | H01L 24/83 |
| 2019/0385951 A1* | 12/2019 | Chu | H01L 23/5386 |
| 2020/0006141 A1* | 1/2020 | Wang | H01L 24/09 |
| 2020/0075488 A1* | 3/2020 | Wu | H01L 24/96 |
| 2020/0075496 A1* | 3/2020 | Yu | H01L 24/32 |
| 2020/0083201 A1* | 3/2020 | Suk | H01L 24/09 |

* cited by examiner

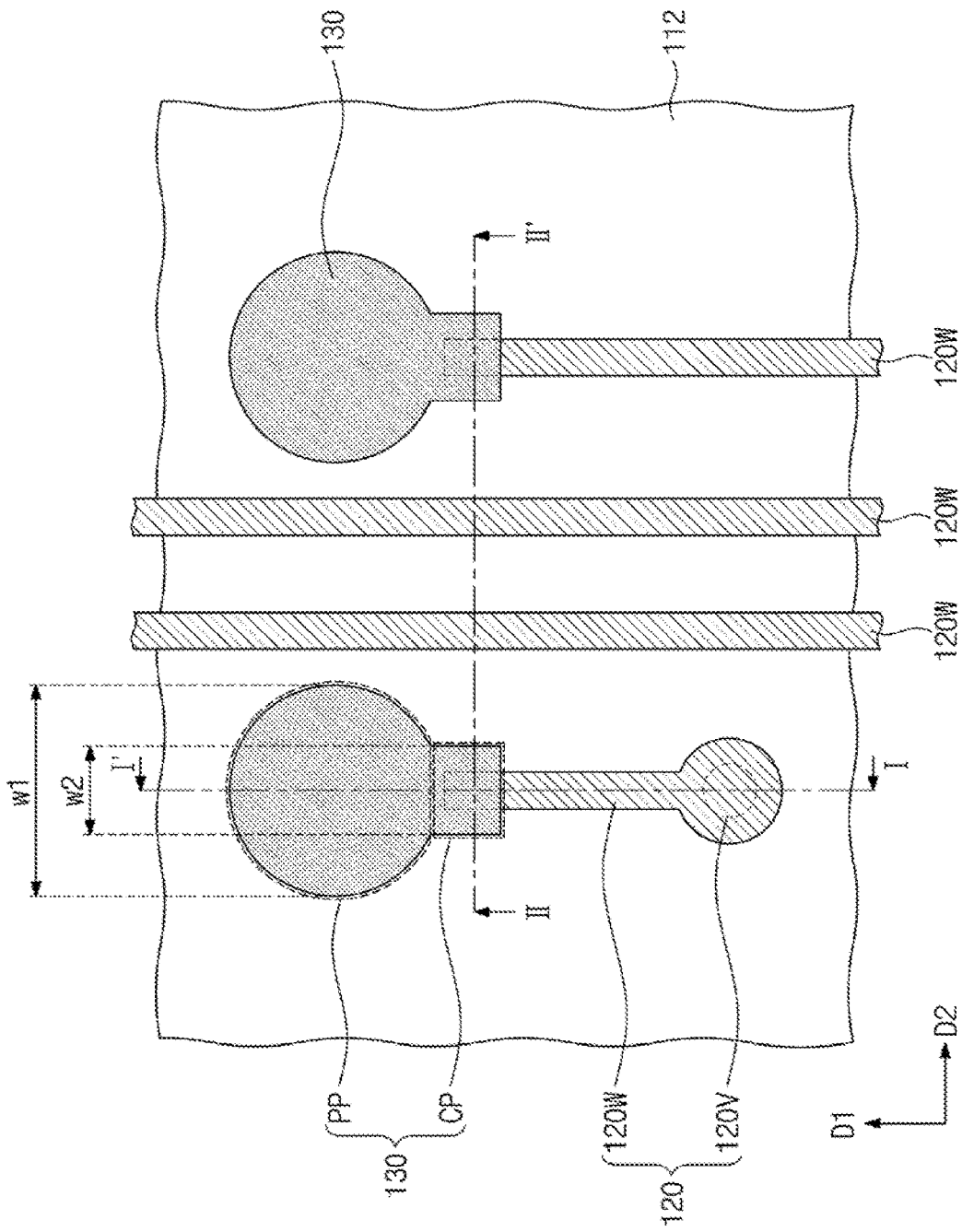

SEMICONDUCTOR PACKAGE INCLUDING A REDISTRIBUTION STRUCTURE

CROSS-REFERENCE TO RELATED APPLICATION

This U.S. nonprovisional application claims priority under 35 U.S.C. § 119 to Korean Patent Application No. 10-2020-0107797 filed on Aug. 26, 2020 in the Korean Intellectual Property Office, the disclosure of which is incorporated by reference herein in its entirety.

TECHNICAL FIELD

The present inventive concept relates to a semiconductor package, and more particularly, to a semiconductor package including a redistribution structure.

DISCUSSION OF THE RELATED ART

The rapid development of electronic industry and user's requirements cause electronic products to decrease in size. To fabricate electronic products with compactness, high performance, and a huge capacity, research and development is continuously conducted on semiconductor chips including through-silicon is structures and semiconductor packages comprising the same. For high integration of semiconductor devices, a method for stacking a plurality of semiconductor chips may be used. For example, a multi-chip package, in which a plurality of semiconductor chips are mounted in a single semiconductor package, or a system-in package, in which stacked different chips are operated as one system, may be used for a stacked plurality of semiconductor chips. The high integration of semiconductor devices brings about miniaturization of pads that connect a plurality of stacked semiconductor chips to each other. The miniaturization of pads may use a precise alignment between the plurality of stacked semiconductor chips.

SUMMARY

According to an exemplary embodiment of the present inventive concept, a semiconductor package includes: a first wiring pattern; a dielectric layer that covers the first wiring pattern; a second wiring pattern on the dielectric layer, wherein the second wiring pattern includes a line pan that extends in a first direction and a via part that connects the line part to the first wiring pattern; a pad pattern electrically connected to the second wiring pattern, wherein the pad pattern includes a connection part and an extension pan, wherein the connection part covers a first surface of the line part of the second wiring pattern, and the extension part has a top surface at a level lower than a level of the top surface of the line part of the second wiring pattern; and a seed pattern between the extension part and the dielectric layer.

According to an exemplary embodiment of the present inventive concept, a semiconductor package includes: a lower redistribution structure; a first semiconductor chip on the lower redistribution structure; a dielectric layer on the first semiconductor chip; a first wiring pattern in the dielectric layer; a second wiring pattern on the dielectric layer, wherein the second wiring pattern includes a line part that extends in a first direction and a via part that connects the line part to the first wiring pattern; a pad pattern electrically connected to the second wiring pattern, wherein the pad pattern includes a connection part and an extension part, wherein the connection part covers a top surface of the line part of the second wiring pattern, and the extension part has a top surface at a level lower than a level of the top surface of the line part of the second wiring pattern; a passivation pattern that covers the second wiring pattern and the connection part of the pad pattern, wherein the passivation pattern has a pad opening that exposes at least a portion the extension part of the pad pattern; a seed pattern between the pad pattern and the dielectric layer; a connection terminal in the pad opening overlapping the extension part of the pad pattern; and a second semiconductor chip on the connection terminal and electrically connected to the lower redistribution structure through the connection terminal.

According to an exemplary embodiment of the present inventive concept, a semiconductor package includes: a first wiring pattern; a dielectric layer that covers the first wiring pattern; a second wiring pattern on the dielectric layer, wherein the second wiring pattern including a line part that extends in a first direction and a via part that connects the line part to the first wiring pattern; and a pad pattern electrically connected to the second wiring pattern, wherein the pad pattern includes an extension part and a connection part, wherein the extension part has a width greater than a width of the line part, and the connection part connects the extension part to the line part. The connection part covers a top surface and a lateral surface of the line part of the second wiring pattern.

BRIEF DESCRIPTION OF THE DRAWINGS

FIG. 1 illustrates a plan view partially showing a redistribution structure according to an exemplary embodiment of the present inventive concept.

DETAILED DESCRIPTION OF THE EMBODIMENTS

The following will describe in detail a redistribution structure and a semiconductor package including the same according to an exemplary embodiment of the present inventive concepts with reference to the accompanying drawings.

Figure 2A:
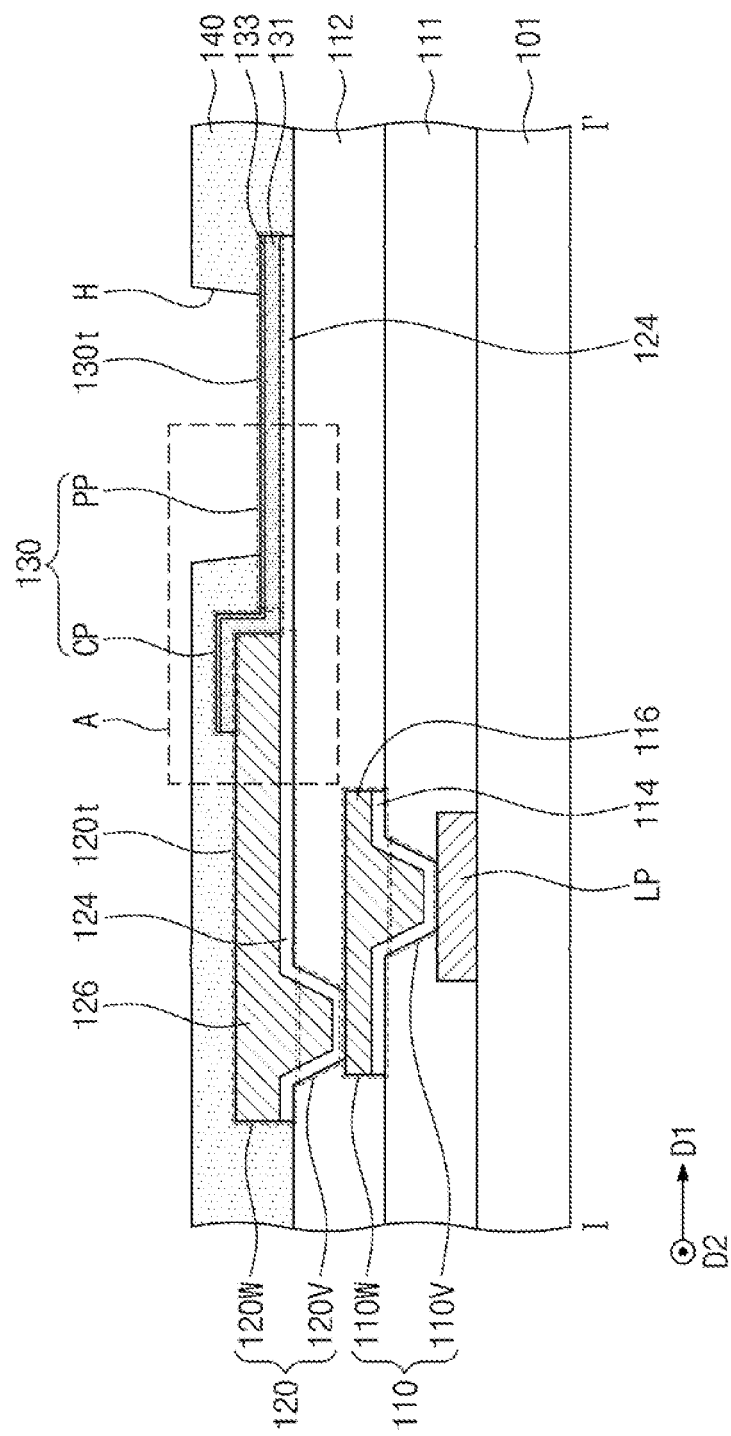
FIG. 2A illustrates a cross-sectional view taken along line I-I' of FIG. 1.
Figure 2B:
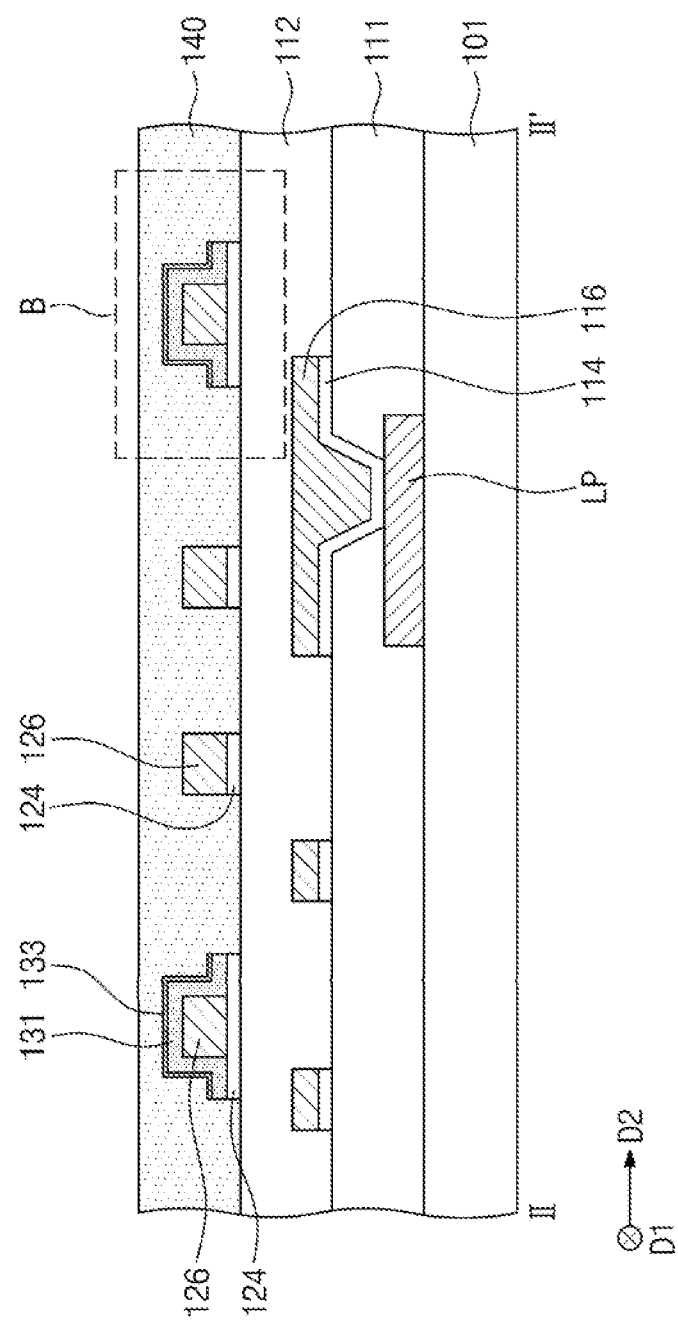
FIG. 2B illustrates a cross-sectional view taken along line II-II' of FIG. 1.
Figure 3A:
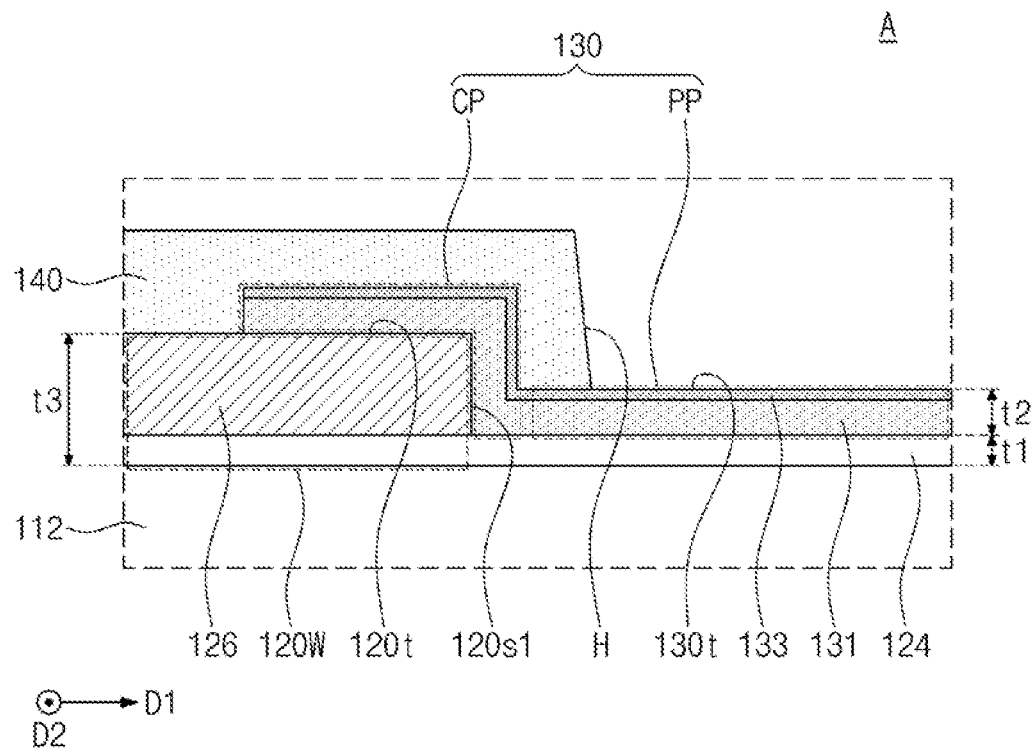
FIG. 3A illustrates an enlarged cross-sectional view showing section A of FIG. 2A.
Figure 3B:
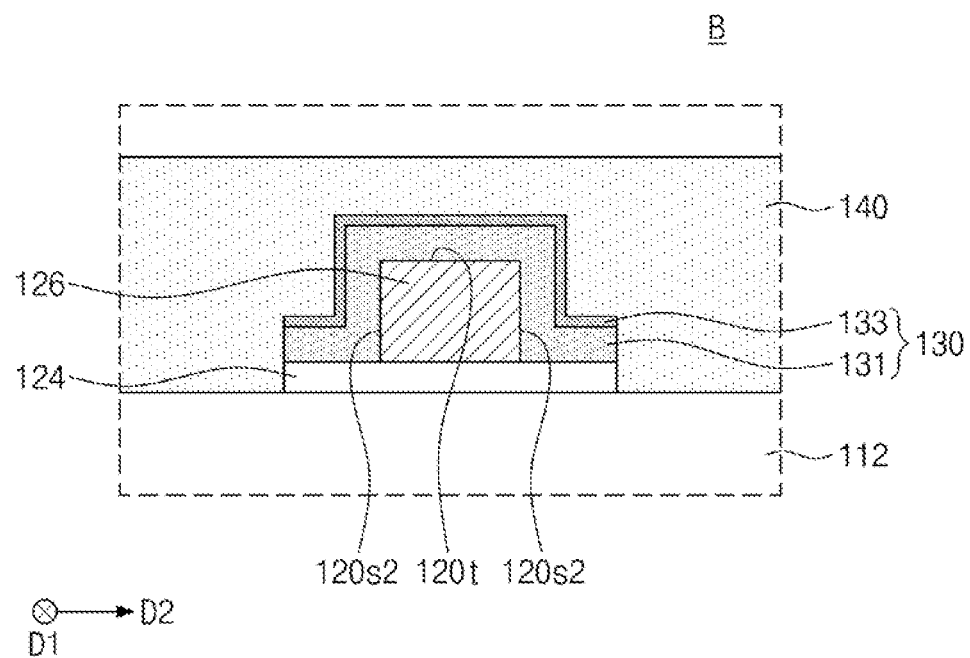
FIG. 3B illustrates an enlarged cross-sectional view showing section B of FIG. 2B.

FIG. 1 illustrates a plan view partially showing a redistribution structure according to an exemplary embodiment of the present inventive concept. FIG. 2A illustrates a cross-sectional view taken along line I-I' of FIG. 1. FIG. 2B illustrates a cross-sectional view taken along line II-II' of FIG. 1. FIG. 3A illustrates an enlarged cross-sectional view showing section A of FIG. 2A, FIG. 3B illustrates an enlarged cross-sectional view showing section B of FIG. 2B.

Referring to FIGS. 1, 2A, and 2B, a redistribution structure may include a lower pad LP, a first wiring pattern 110, a second wiring pattern 120, a pad pattern 130, dielectric layers 111 and 112, and a passivation pattern 140. The dielectric layers 111 and 112 may include first and second dielectric layers 111 and 112 that are sequentially stacked. The redistribution structure may be provided on a lower substrate 101. For example, the lower substrate 101 may be a carrier substrate for forming or carrying the redistribution structure or may be a semiconductor device connected to the redistribution structure.

The lower pad LP may be provided ort a top surface of the lower substrate 101. The lower pad LP may be used to electrically connect the redistribution structure to an external device. The lower pad LP may include a metallic material, such as copper. The lower pad LP may be provided in the first dielectric layer 111. For example, the lower pad LP may have lateral and top surfaces covered with the first dielectric layer 111. The lower pad LP may have a bottom surface not covered with the first dielectric layer 111.

In this description, the terms "top surface" and "bottom surface" are used to briefly explain components. However, the terms "top surface" and "bottom surface" are merely adopted to distinguish one surface of the component from another surface of the component. According to an exemplary embodiment of the present inventive concept, the terms "top surface" and "bottom surface" of any component may be interchangeably used based on a direction and/or orientation in which the component is disposed. Therefore, any surface called "top surface" may be referred to as "bottom surface", and any surface called "bottom surface" may be referred to as "top surface".

The first dielectric layer 111 may be provided on the lower substrate 101. The first dielectric layer 111 may be a lowermost dielectric layer of the redistribution structure. The first dielectric layer 111 may have a bottom surface coplanar with that of the lower pad LP. The first dielectric layer 111 may include an inorganic material, such as silicon oxide (SiOx), silicon nitride (SiNx), and/or silicon oxynitride (SiON). According to an exemplary embodiment of the present inventive concept, the first dielectric layer 111 may include a photosensitive polymer. The photosensitive polymer may include, for example, one or more of photosensitive polyimide, polybenzoxazole, phenolic polymers, and/or benzocyclobutene polymers. The first dielectric layer 111 may be a positive photosensitive polymer, but the present inventive concept is not limited thereto.

The first wiring pattern 110 may be provided on the lower pad LP. The first wiring pattern 110 may include a first line part 110W and a first via part 110V.

For example, the first line part 110W may horizontally extend on a top surface of the first dielectric layer 111. For example, the first line part 110W may have a top surface parallel to the bottom surface and/or top surface of the first dielectric layer 111 or the top surface of the lower pad LP. The first line part 110W may be provided on and connected to the first via part 110V. For example, the first line part 110W and first via part 110V may be a single unified component or separate components. The first line part 110W may have a width and a length greater than those of the first via part 110V. However, the present inventive concept is not limited thereto.

The first via part 110V may be positioned between the lower pad LP and the first line part 110W. The first via part 110V may electrically connect the lower pad LP to the first line part 110W. The first via part 110V may be disposed in the first dielectric layer 111. For example, the first via part 110V may have a bottom surface at a vertical level lower than that of the top surface of the first dielectric layer 111. The first via part 110V may be disposed on the top surface of the lower pad LP. For example, the first via part 110V may directly contact the top surface of the lower pad LP. The first via part 110V may have a width less than that of the lower pad LP. The width of the first via part 110V may decrease as the distance between the lower pad LP and the first via part 110V decreases. However, the present inventive concept is not limited thereto. For example, the width of the first via part 110V may increase as the distance between the lower pad LP and the first via part 110V decreases.

According to an exemplary embodiment of the present inventive concept, the lower pad LP may be omitted. When the lower pad LP is omitted, the first via part 110V may completely penetrate the first dielectric layer 111 and may be exposed on the bottom surface of the first dielectric layer 111.

The first wiring pattern 110 may include a first seed pattern 114 and a first conductive layer 116. The first conductive layer 116 may be provided on the top surface of the first dielectric layer 111 and may downwardly extend from the top surface of the first dielectric layer 111. The first conductive layer 116 may not directly contact the lower pad LP. The first conductive layer 116 may include metal, such as copper. The first seed pattern 114 may be interposed between the lower pad. LP and the first conductive layer 116 and between the first dielectric layer 111 and the first conductive layer 116. The first seed pattern 114 may be disposed on the lower pad LP. For example, the first seed pattern 114 may directly contact the lower pad LP. The first seed pattern 114 may include a conductive material, such as copper, titanium, or any alloy thereof. According to an exemplary embodiment of the present inventive concept, the first seed pattern 114 and the first conductive layer 116 may include the same metallic material, for example, copper. When the first seed pattern 114 and the first conductive layer 116 include the same material, an indistinct interface may be provided between the first seed pattern 114 and the first conductive layer 116.

For example, each of the first via part 110V and the first line part 110W may include the first seed pattern 114 and the first conductive layer 116. The first seed pattern 114 of the first via part 110V and the first seed pattern 114 of the first line part 110W may be directly connected to each other with no interface therebetween. For example, the first seed pattern 114 of the first via part 110V and the first seed pattern 114 of the first line part 110W may be a single unified body. The first seed pattern 114 of the first via part 110V may be interposed between a bottom surface of the first conductive layer 116 and the top surface of the lower pad LP and between the first dielectric layer 111 and sidewalls of the first conductive layer 116 of the first via part 110V. The first seed pattern 114 of the first line part 110W may be interposed between the first dielectric layer 111 and a bottom surface of the first conductive layer 116 of the first line part 110W. For example, the first seed pattern 114 might not extend onto a sidewall or a top surface of the first conductive layer 116 of the first line part 110W. The first conductive layer 116 of the first via part 110V may be directly connected to the first conductive layer 116 of the first line part 110W. For example, the first conductive layer 116 of the first via part 110V and the first conductive layer 116 of the first line part 110W may be a single unified body.

The second dielectric layer 112 may be disposed at the first dielectric layer 111 and the first line part 110W. For example, the second dielectric layer 112 may cover the top surface of the first dielectric layer 111 and may also cover the top surface and a sidewall of the first line part 110W. For example, the second dielectric layer 112 may contact at least a portion of the top surface of the first conductive layer 116. The second dielectric layer 112 may include an inorganic material, such as silicon oxide (SiOx), silicon nitride (SiNx), or silicon oxynitride (SiON). According to an exemplary embodiment of the present inventive concept, the second dielectric layer 112 may include a photosensitive polymer. The photosensitive polymer may include, for example, one or more of photosensitive polyimide, polybenzoxazole, phenolic polymers, and/or benzocyclobutene polymers. According to an exemplary embodiment of the present inventive concept, the first and second dielectric layers 111 and 112 may include the same material as each other. When the first and second dielectric layers 111 and 112 include the same material as each other, an indistinct interface may be provided between the first and second dielectric layers 111 and 112.

The second wiring pattern 120 may be disposed on and electrically connected to the first wiring pattern 110. The second wiring pattern 120 may include a second line part 120W and a second via part 120V.

For example, the second line part 120W may horizontally extend on a top surface of the second dielectric layer 112. For example, the second line part 120W may have a top surface parallel to the bottom surface of the first dielectric layer 111 and/or the top surface of the lower pad LP. The second line part 120W may overlap and be electrically connected to the second via part 120V. For example, the second line part 120W and second via part 120V may be a single unified component or separate components. The second line part 120W may have a width and a length greater than those of the second via part 120V. For example, as shown in FIG. 1, the second line part 120W may have on, the second via part 120V a segment whose width is greater than that of another segment not on the second via part 120V. The segment of the second line part 120W, which is on the second via part 120V, may have a rounded shape. The second line part 120W may have a linear shape at its other segment, which is not on the second via part 120. For example, the other segment of the second line part 120W may have a linear shape that extends in a first direction D1.

The second via part 120V may be positioned between the first line part 110W and the second line part 120W. The second via part 120V may electrically connect the first wiring pattern 110 to the second line part 120W. The second via part 120V may be disposed in the second dielectric layer 112. For example, the second via part 120V may have a bottom surface at a vertical level lower than that of the top surface of the second dielectric layer 112. The second via part 120V may be disposed on a top surface of the first wiring pattern 110. For example, the second via part 120V may directly contact the top surface of the first wiring pattern 110. The width of the second via part 120V may, decrease as the distance between the first wiring pattern 110 and the second via part 120V decreases. However, the present inventive concept is not limited thereto. For example, the width of the second via part 120V may increase as the distance between the first wiring pattern 110 and the second via part 120V decreases.

The second wiring pattern 120 may include a second seed pattern 124 and a second conductive layer 126. The second conductive layer 126 may be disposed on the top surface of the second dielectric layer 112 and in the second dielectric layer 112. The second seed pattern 124 may be interposed between the first wiring pattern 110 and the second conductive layer 126 and between the second dielectric layer 112 and the second conductive layer 126. The second seed pattern 124 may be disposed on the first wiring pattern 110. For example, the second see pattern 124 may directly contact the first wiring pattern 110.

For example, each of the second via part 120V and the second line part 120W of the second wiring pattern 120 may include the second seed pattern 124 and the second conductive layer 126. The second seed pattern 124 of the second via part 120V may be provided between the first conductive layer 116 and a bottom surface of the second conductive layer 126 of the second via part 120V and between the second dielectric layer 112 and sidewalls of the second conductive layer 126 of the second via part 120V.

The second seed pattern 124 of the second line part 120W may be interposed between the top surface of the second dielectric layer 112 and a bottom surface of the second conductive layer 126 of the second line part 120W. For example, the second seed pattern 124 of the second line part 120W may not extend onto a sidewall or a top surface of the second conductive layer 126 of the second line part 120W. The second seed pattern 124 may include the same material as that discussed it the example of the first seed pattern 114. The second conductive layer 126 may include the same material as that discussed in the example of the first conductive layer 116.

The pad pattern 130 may be provided on a top surface of the second wiring pattern 120 and a top surface of the second seed pattern 124. The second seed pattern 124 may horizontally extend along the top surface of the second dielectric layer 112 and may be provided between the top surface of the second dielectric layer 112 and a bottom surface of the pad pattern 130. The pad pattern 130 may at least partially overlap the second wiring pattern 120. The pad pattern 130 may include an extension part PP on the top surface of the second seed pattern 124 and a connection part CP that connects the second line part 120W and the extension part PP to each other. For example, the extension part PP may extend from the connection part CP. As an additional example, the extension part PP may not be disposed on the second wiring pattern 120.

The connection part CP may be disposed on the second wiring pattern 120. For example, the connection part CP may cover the top surface and lateral surfaces of the second wiring pattern 120. For example, the connection part CP may be disposed adjacent to one end of the second wiring pattern 120 and may partially cover the top surface and lateral surfaces of the second wiring pattern 120. For example, the connection part CP may extend along sidewalk of the second line part 120W and onto the top surface of the second seed pattern 124. Therefore, a portion of the connection part CP may contact the top surface of the second seed pattern 124. The connection part CP may have a tetragonal shape from a plan view. The connection part CP may have a certain width w2 in a second direction D2. For example, the width w2 in the second direction D2 of the connection part CP may range from about 15 μm to about 30 μm.

The extension part PP may be provided at one side of the connection part CP. The extension part PP may be electrically connected through the connection part CP to the second wiring pattern 120. The extension part PP and the connection part CP may be directly connected to each other with no interface therebetween. For example, the extension part PP and the connection part. CP may be a single unified body. The extension part. PP may have a circular shape from a plan view. The extension part PP may have a width w1 in the second direction D2 greater than the width w2 in the second direction D2 of the connection part CP. The width w1 of the extension part PP may have a value ranging from about 2 times to about 4 times the width w2 of the connection part CP. For example, the width w1 in the second direction D2 of the extension part PP may range from about 20 μm to about 60 μm.

Referring to FIGS. 1, 3A, and 3B, the second seed pattern 124 may extend from a gap between the second conductive layer 126 of the second line part 120W and the second dielectric layer 112 toward a gap between the pad pattern 130 and the second dielectric layer 112. Therefore, as an example, the second conductive layer 126 of the second line part 120W may have bottom surface coplanar with that of the pad pattern 130. The pad pattern 130 may have a thickness t2 greater than a thickness t1 of the second seed pattern 124. The thickness t2 of the pad pattern 130 may be about 1.5 times to about 10 times the thickness t1 of the second seed pattern 124. For example, the thickness t1 of the second seed pattern 124 may range from about 0.1 μm to about 2 μm. For example, the thickness t2 of the pad pattern 130 may range from about 2 μm to about 10 μm. As the thickness t2 of the pad pattern 130 is greater than the thickness t1 of the second seed pattern 124, an electrical resistance may be reduced between the second wiring pattern 120 and a connection terminal, such as a solder hail, which will be disposed on the pad pattern 130.

The thickness t2 of the pad pattern 130 may be less than a thickness t3 of the second line part 120W. The thickness t3 of the second line part 120W may have a value ranging from about 2 times to about 5 times the thickness t2 of the pad pattern 130. The thickness t3 of the second line part 120W may range, for example, from about 5 μm to about 15 μm.

The extension part PP of the pad pattern 130 may be spaced apart in the first direction D1 from the second line part 120W, and the connection part CP may be provided between and electrically connect the extension part PP and the second line part 120W. For example, the thickness t2 of the pad pattern 130 may be constant from one end of the connection part CP to another end of the connection part CP. However, the present inventive concept is not limited thereto.

The second line part 120W may have a first lateral surface 120s1 that faces the extension part PP and is covered with the connection part CP. In addition, the second line part 120W may have second lateral surfaces 120s2 that are opposite to each other in the second direction D2 and are covered with the connection part CP. The connection part CP may conformally and partially cover a top surface 120t, the first lateral surface 120s1, and the second lateral surfaces 120s2 of the second wiring pattern 120. The connection part. CP may extend onto the top surface of the second seed pattern 124 to thereby directly contact the second seed pattern 124.

The extension part PP may be disposed adjacent to the first lateral surface 120s1 of the second line part 120W and may horizontally extend. The extension part PP may have a top surface 130t at a vertical level lower than that of the top surface 120t of the second line part 120W. The extension part PP may be electrically connected through the connection part. CP to the second wiring pattern 120.

The pad pattern 130 may include a first metal layer 131 and a second metal layer 133 on the first metal layer 131. The first metal layer 131 may have a thickness greater than that of the second metal layer 133. The first metal layer 131 may have a thickness of, for example, about 2 μm to about 8 μm. The second metal layer 133 may have a thickness of, for example, about 0.1 μm to about 0.8 μm. The first and second metal layers 131 and 133 may include different metal elements from each other. For example, the first metal layer 131 may include nickel (Ni). For example, the second metal layer 133 may include gold (Au).

In an exemplary embodiment of the present inventive concept, the first metal layer 131 may have a thickness less than that of the second metal layer 133. However, the present inventive concept is not limited thereto. For example, the first metal layer 131 may have the same thickness as that of the second metal layer 133.

Referring back to FIGS. 1, 2A, and 2B, the passivation pattern 140 may be disposed on the second dielectric layer 112 and may cover the second wiring pattern 120 and the pad pattern 130. The passivation pattern 140 may partially cover the top surface of the second dielectric layer 112. The passivation pattern 140 may cover the lateral surfaces of the second line part 120W and at least a portion of the top surface of the second line part 120W. The passivation pattern 140 may partially cover the top surface of the pad pattern 130. The passivation pattern 140 may have a pad opening H that at least partially exposes a top surface of the extension part PP of the pad pattern 130. The top surface of the extension part PP exposed to the pad opening H may serve as a pad region on which is provided a connection terminal such as a solder hall. The pad opening H may have a bottom surface (or, e.g., the top surface 130t of the extension part. PP) that may be located at a vertical level lower than that of the top surface 120t of the second line part 120W. Therefore, when a connection terminals is provided in the pad opening H, the connection terminal may have a bottom surface at a vertical level lower than that of the top surface 120 of the second line part 120W. The pad opening H may have an inner wall that is inclined relative to a direction perpendicular to the top surface of the second dielectric layer 112. The pad opening H may have a width that decreases toward the top surface 130t of the extension part PP.

The passivation pattern 140 may include a dielectric polymer, such as an epoxy-based polymer. The passivation pattern 140 may include an Ajinomoto build-up film (ABF). According to an exemplary embodiment of the present inventive concept, the passivation pattern 140 may include a photosensitive material. The photosensitive material may include, for example, a photo-imagable dielectric (PID).

Figure 4:
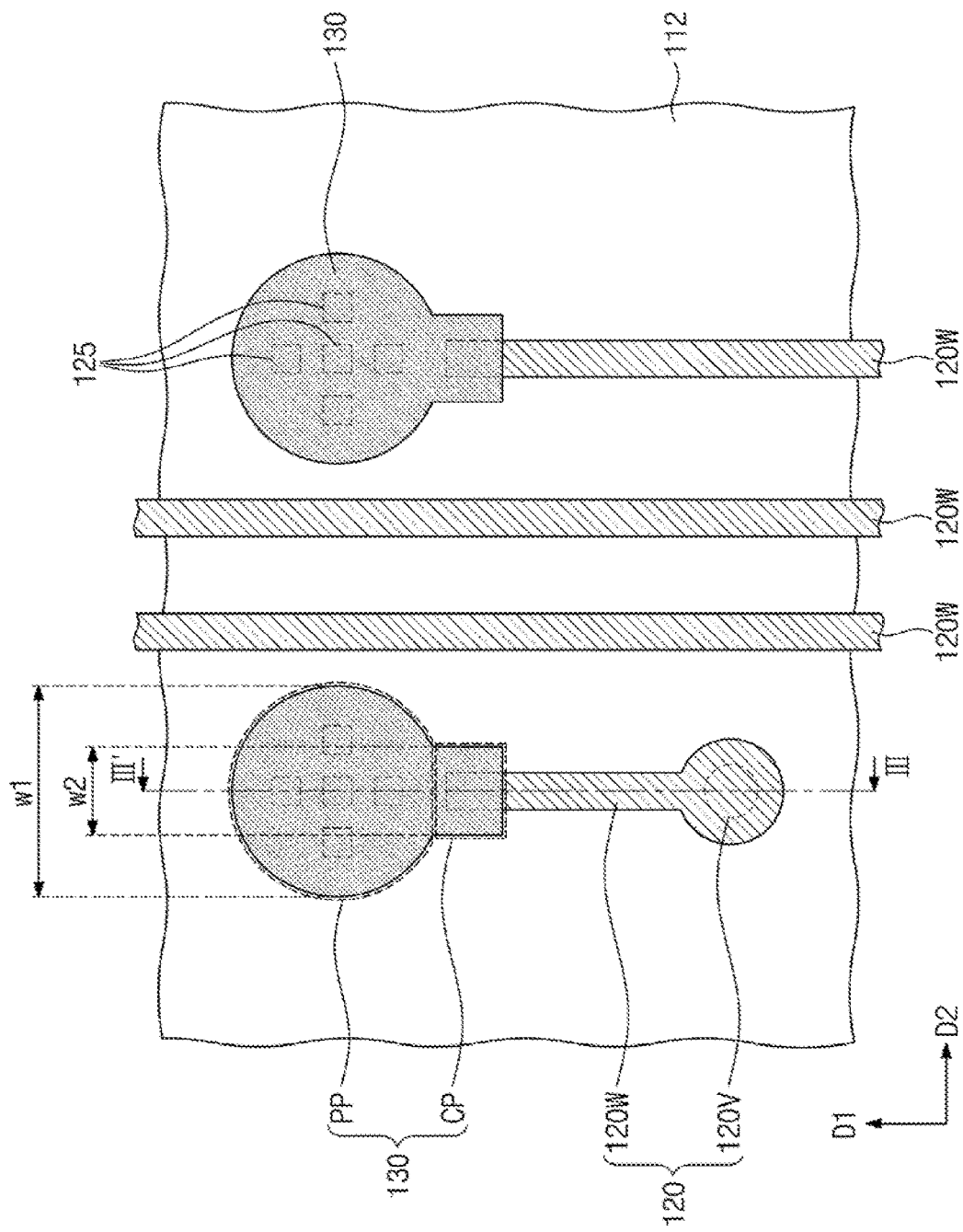
FIG. 4 illustrates a plan view partially showing a redistribution structure according to an exemplary embodiment of the present inventive concept.
Figure 5:
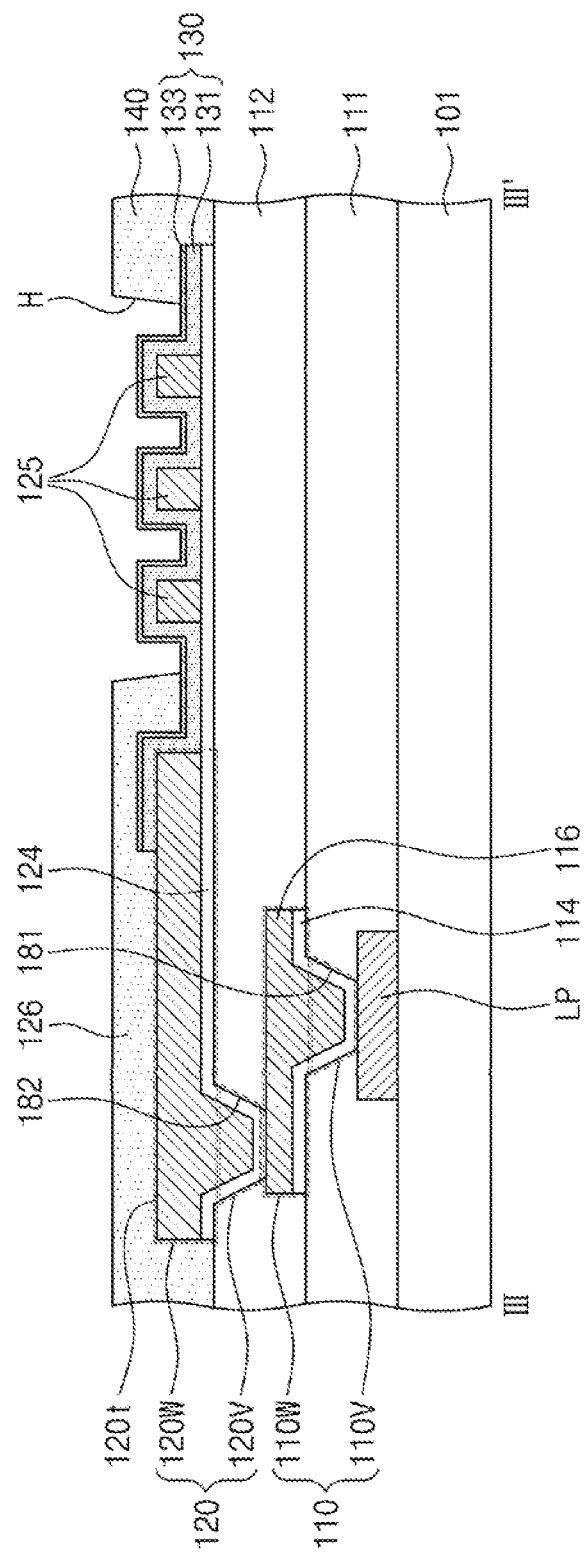
FIG. 5 illustrates a cross-sectional view taken along line III-III' of FIG. 4.

FIG. 4 illustrates a plan view partially showing a redistribution structure according to an exemplary embodiment of the present inventive concept. FIG. 5 illustrates a cross-sectional view taken along line III-III' of FIG. 4.

Referring to FIGS. 4 and 5, the redistribution structure may further include conductive protrusions 125 between the pad pattern 130 and the second seed pattern 124. The pad pattern 130 may conformally cover lateral and top surfaces of the conductive protrusions 125. For example, each of the conductive protrusions 125 may have a polygonal shape such as a rectangular or square shape. For example, the conductive protrusions 125 may have their tetragonal shapes from a plan view, but the present inventive concept is not limited thereto. For another example, each of the conductive protrusions 125 may have a circular shape or a polygonal shape from a plan view. As an additional example, the conductive protrusions 125 may separated from one another.

FIGS. 6A to 14A illustrate cross-sectional views taken along line I-I' of FIG. 1, showing a method of fabricating a redistribution structure according to an exemplary embodiment of the present inventive concept. FIGS. 6B to 14B illustrate cross-sectional views taken along line II-II' of FIG. 1, showing a method of fabricating a redistribution structure according to an exemplary embodiment of the present inventive concept.

Figure 6A:
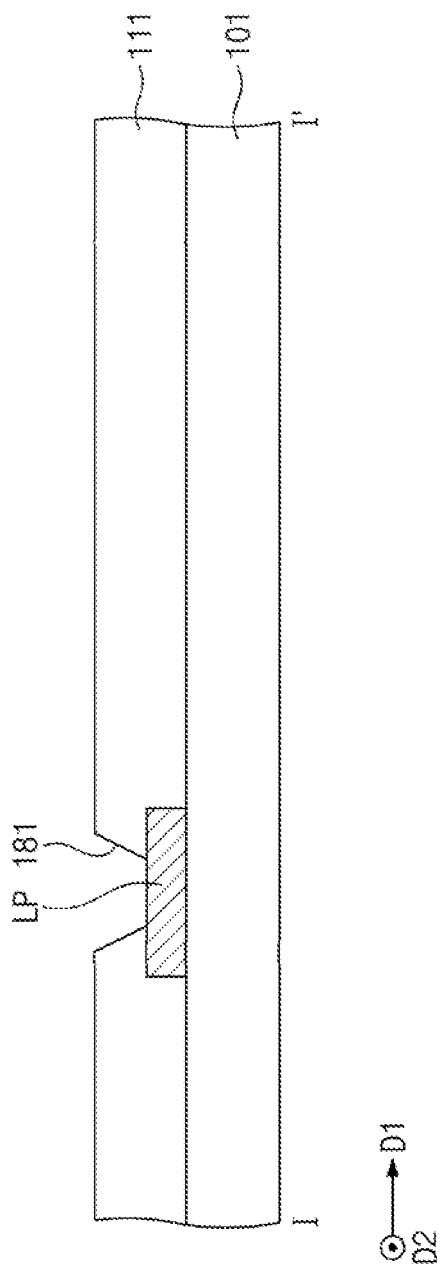
FIGS. 6A, 7A, 8A, 9A, 10A, 11A, 12A, 13A, and 14A illustrate cross-sectional views taken along line I-I' of FIG. 1, showing a method of fabricating a redistribution structure according to an exemplary embodiment of the present inventive concept.
Figure 6B:
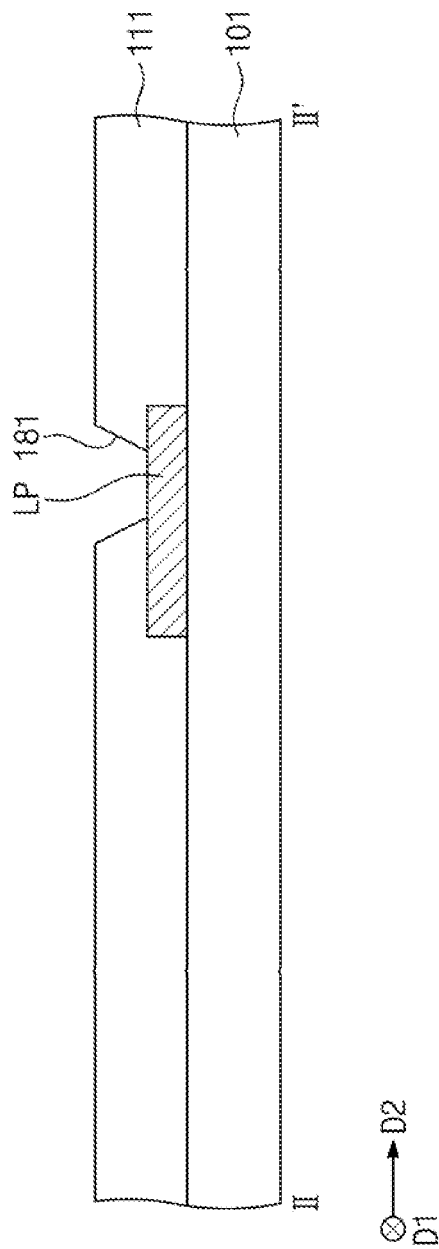
FIGS. 6B, 7B, 8B, 9B, 10B, 11B, 12B, 13B, and 14B illustrate cross-sectional views taken along line II-II' of FIG. 1, showing a method of fabricating a redistribution structure according to an exemplary embodiment of the present inventive concept.

Referring to FIGS. 1, 6A, and 6B, a lower pad LP may be formed on a lower substrate 101. The formation of the lower pad LP may include forming a metal layer on the lower substrate 101 and patterning the metal layer.

A first dielectric layer 111 may be formed on the lower substrate 100. The first dielectric layer 111 may cover top and lateral surfaces of the lower pad LP. The first dielectric layer 111 may be formed by a coating process, such as spin coating or slit coating. The first dielectric layer 111 may include an inorganic material, such as silicon oxide (SiOx) silicon nitride (SiNx), or silicon oxynitride (SiON). According to an exemplary embodiment of the present inventive concept, the first dielectric layer 111 may include a photosensitive polymer. The photosensitive polymer may include, for example, one or more of photosensitive polyimide, polybenzoxazole, phenolic polymers, and/or benzocyclobutene polymers. According to an exemplary embodiment of the present inventive concept, an adhesive layer may be formed between the lower substrate 101 and the first dielectric layer 111. The adhesive layer may attach the first dielectric layer 111 to the lower substrate 101.

The first dielectric layer 111 may be patterned to form a first hole 181 in the first dielectric layer 111. The first hole 181 may expose the top surface of the lower pad LP. The patterning of the first dielectric layer 111 may be achieved by exposure and development processes. The exposure process may be a negative tone exposure process or a positive tone exposure process.

Afterwards, a cure process may be performed on the first dielectric layer 111. The curing of the first dielectric layer 111 may be achieved by a thermal cure process. While the cure process is performed, the first hole 181 may, for example, have a shape whose width decreases toward the lower pad LP. In this case, after the cure process, the first hole 181 may, have a tapered shape. The first hole 181 may expose an inner wall of the first dielectric layer 111. The inner wall of the first dielectric layer 111 may correspond to a sidewall of the first hole 181.

Figure 7A:
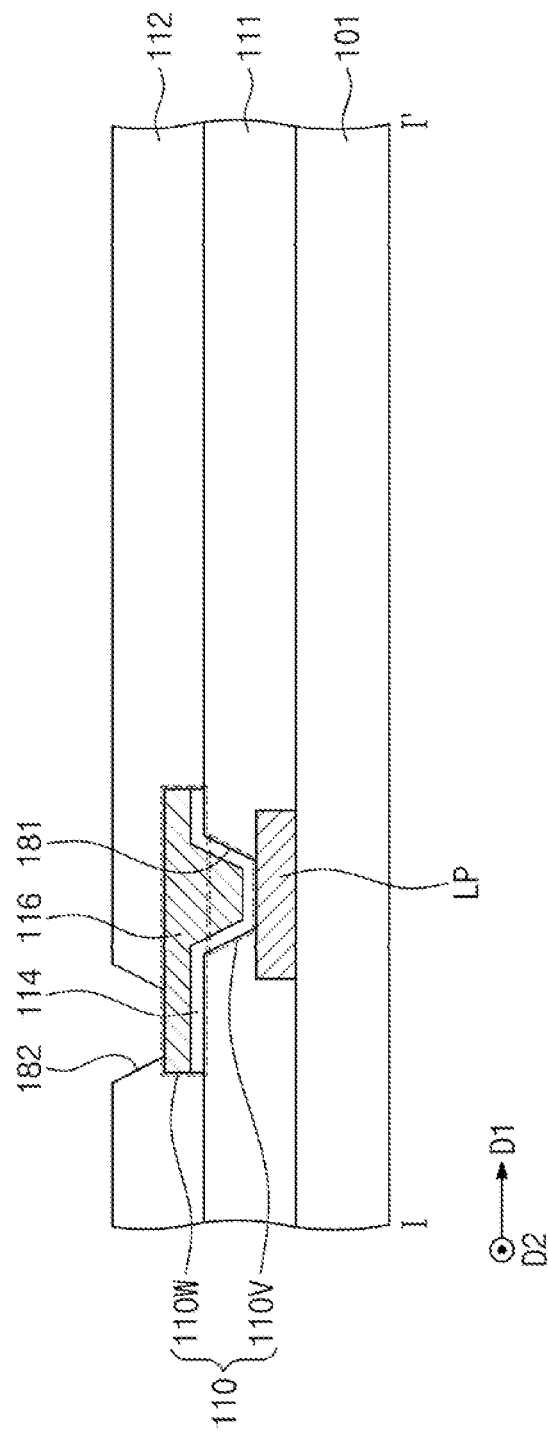
Figure 7B:
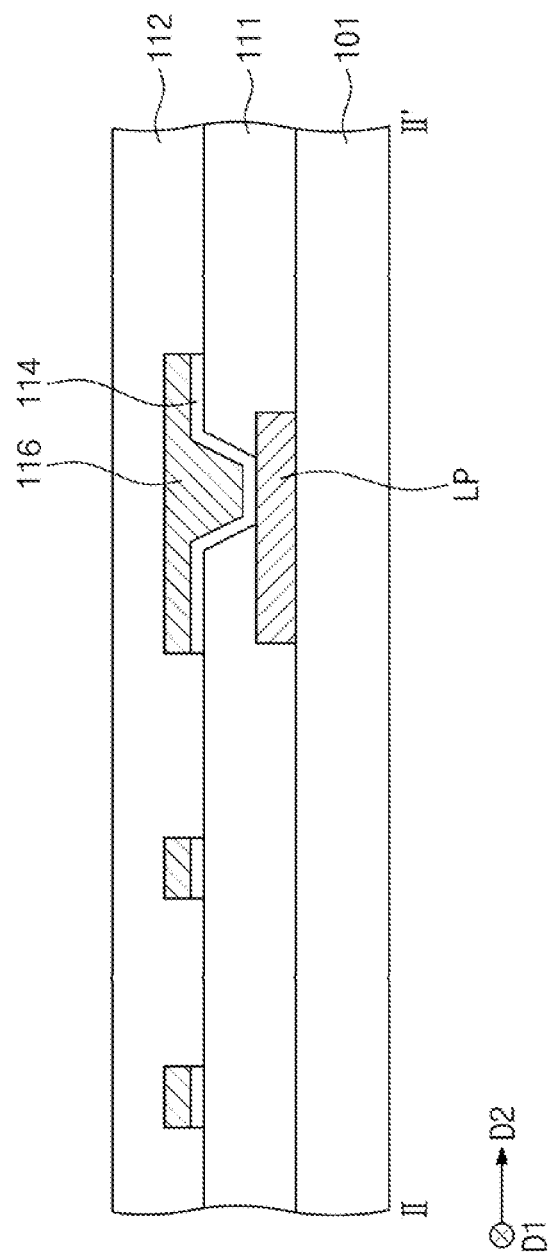

Referring to FIGS. 1, 7A, and 7B, a first wiring pattern 110 may be formed on the first dielectric layer 111. The first wiring pattern 110 may include a first via part 110V that fills the first hole 181 and a first line part 110W on the first via part 110V. The first wiring pattern 110 may include a first seed pattern 114 and a first conductive layer 116 on the first seed pattern 114. The formation of the first wiring pattern 110 may be similar to that of a second wiring pattern 120 which will be discussed below, and thus a detailed description thereof may be omitted.

A second dielectric layer 112 may be formed on the first dielectric layer 111, covering the first wiring pattern 110. The second dielectric layer 112 may cover a sidewall and a top surface of the first wiring pattern 110. The second dielectric layer 112 may include, for example, one or more of those example materials included in the first dielectric layer 111. According to an exemplary embodiment of the present inventive concept, the first and second dielectric layers 111 and 112 may be formed of the same material. An indistinct interface may be provided between the first and second dielectric layers 112 and 111, but the present inventive concept is not limited thereto. A second hole 182 may be formed in the second dielectric layer 112 to thereby expose the top surface of the first wiring pattern 110. After the formation of the second hole 182, a cure process may be performed on the second dielectric layer 112. Therefore, the second hole 182 may have, for example, a tapered shape.

Figure 8A:
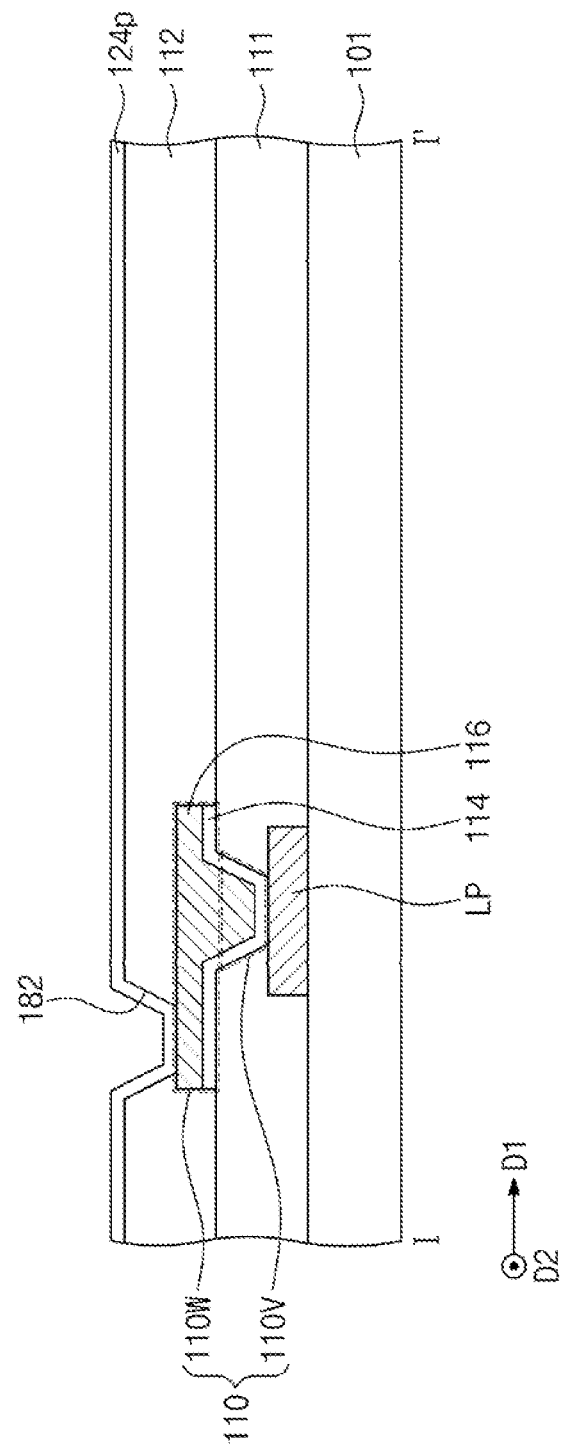
Figure 8B:
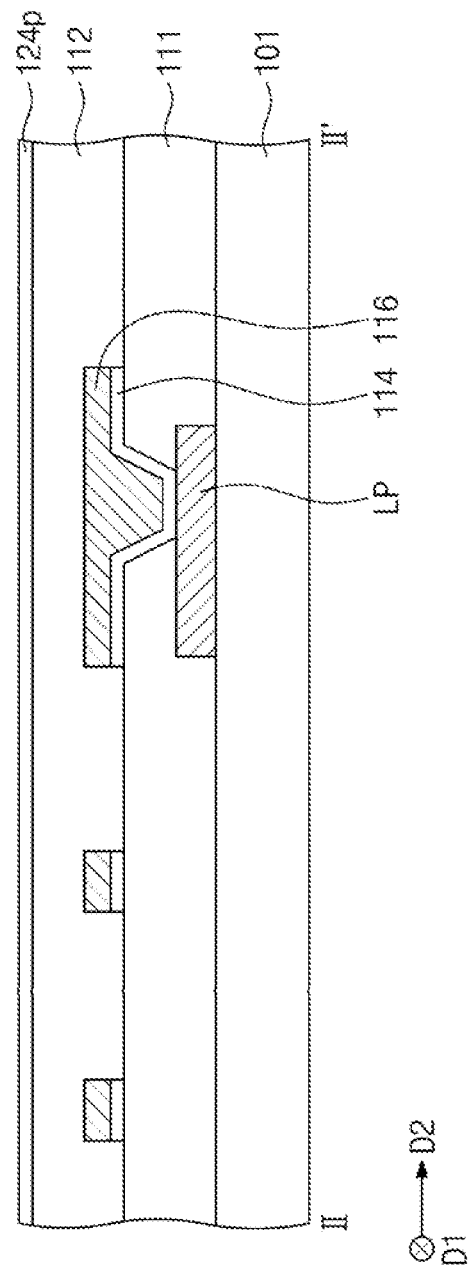

Referring to FIGS. 1, 8A, and 8B, a second seed layer 124p may be formed in the second hole 182 and on a top surface of the second dielectric layer 112. The second seed layer 124p may conformally cover the exposed top surface of the first wiring pattern 110, an inner wall of the second dielectric layer 112, and the top surface of the second dielectric layer 112. The second seed layer 124p may include a conductive material, such as one or more of copper, titanium, and/or tantalum.

Figure 9A:
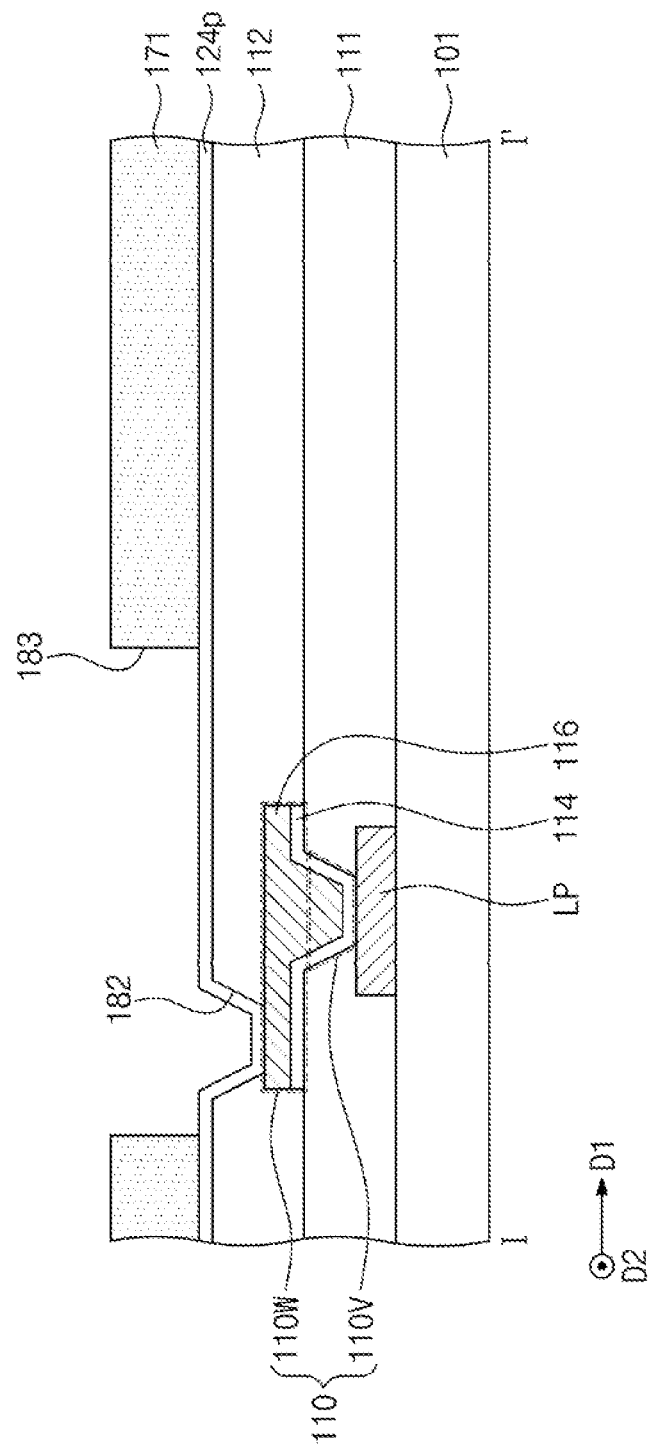
Figure 9B:
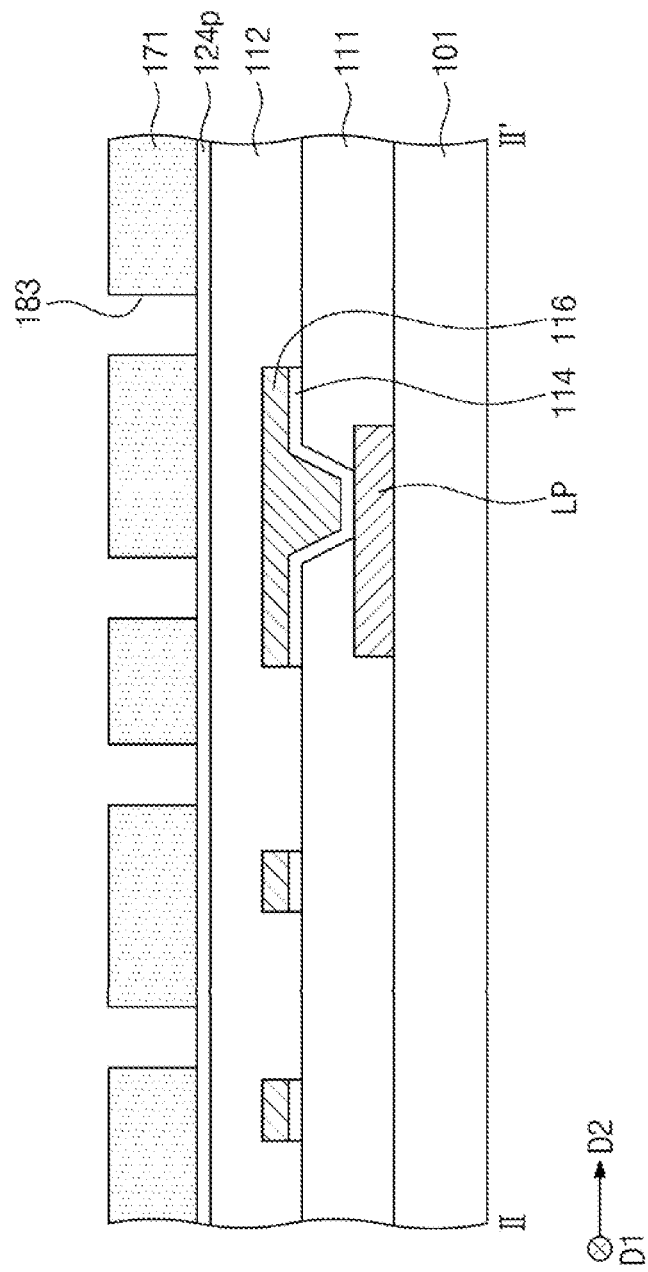

Referring to FIGS. 1, 9A, and 9B, a first resist pattern 171 may be formed on the second dielectric layer 112. The first resist pattern 171 may have a first trench 183. The first trench 183 may be formed to overlap the second hole 182. The first resist pattern 171 may include a different material from those of the first and second dielectric layers 111 and 112. For example, the first resist pattern 171 may include a photoresist material. The photoresist material may include an organic material, such as a polymer. Because the First resist pattern 171 includes the photoresist material, no care process may be required during the formation of the first resist pattern 171. Therefore, the first trench 183 may not change into a tapered shape.

Figure 10A:
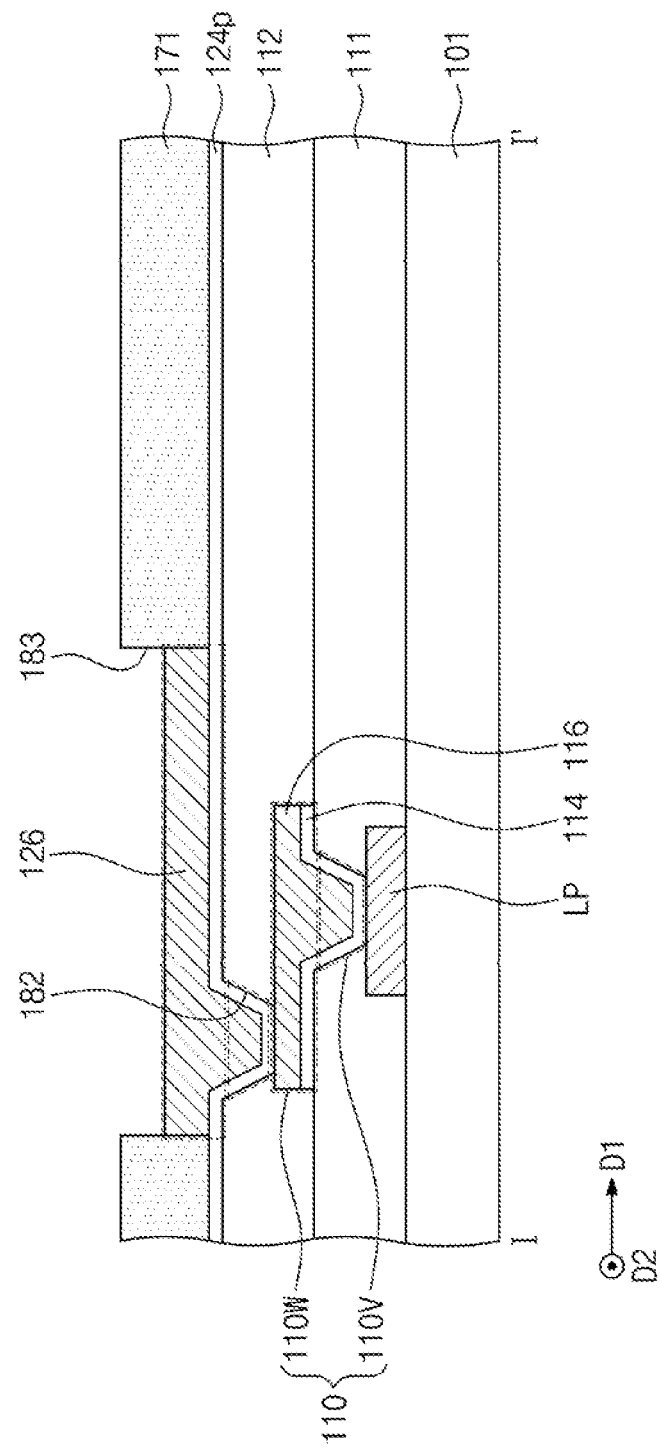
Figure 10B:
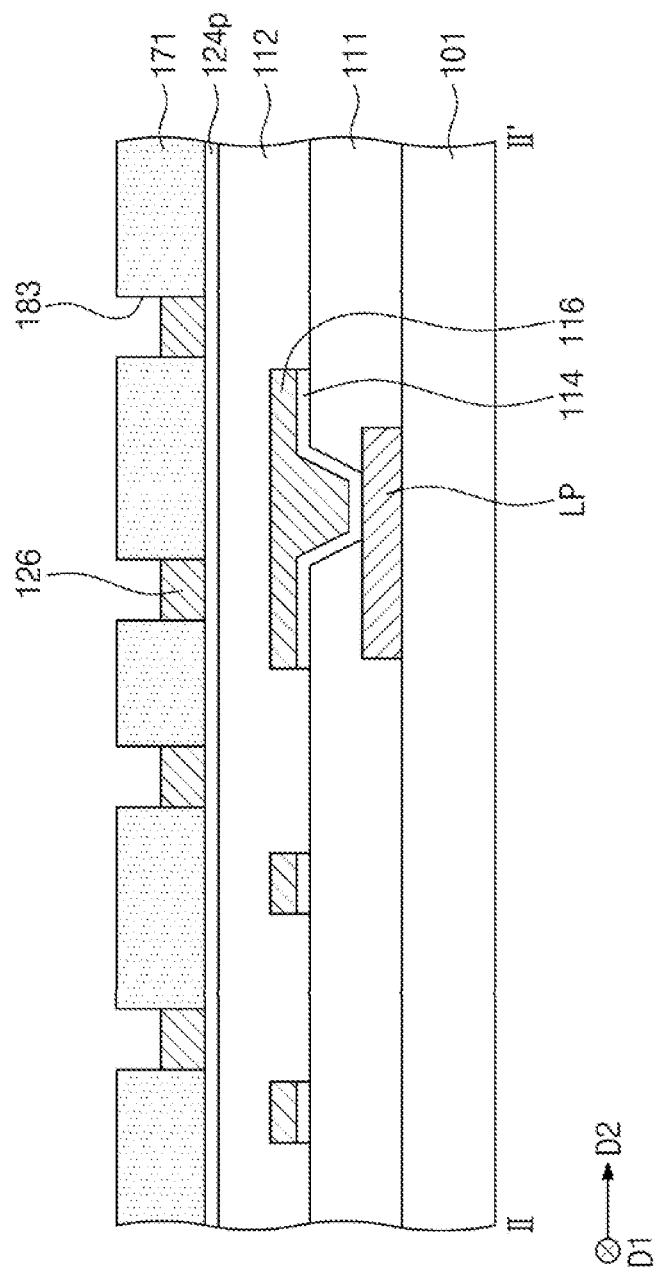

Referring to FIGS. 1, 10A, and 10B, a second conductive layer 126 may be formed in the first trench 183 and the second hole 182, covering the second seed layer 124p. The second conductive layer 126 may be formed by performing, for example, an electroplating process in which the second seed layer 124p is used as an electrode. For example, the second conductive layer 126 may fill the second hole 182 and may not extend onto a top surface of the first resist pattern 171. Therefore, a planarization process may not be performed separately. The second conductive layer 126 may include metal, such as copper.

Figure 11A:
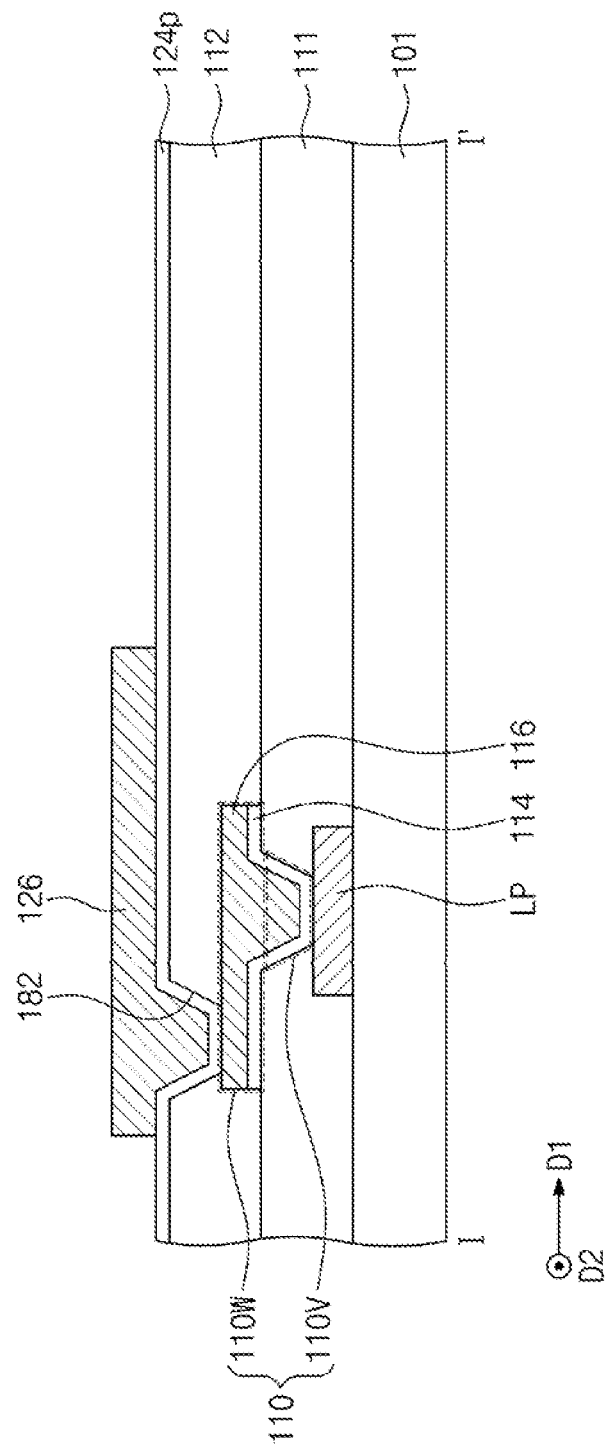
Figure 11B:
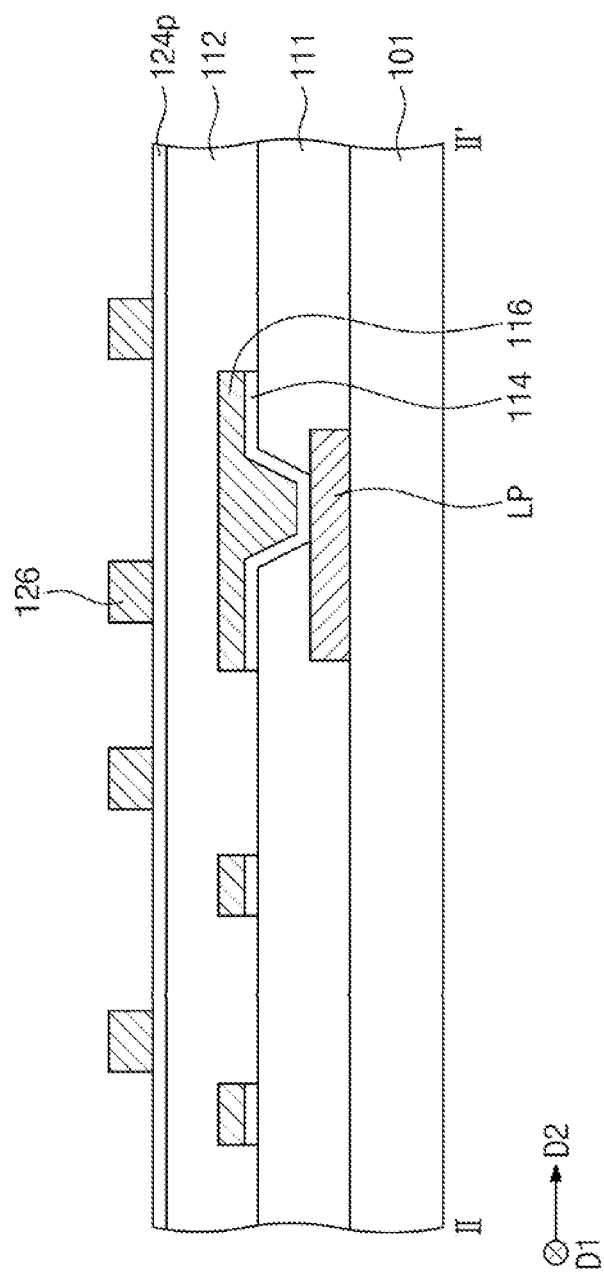

Referring to FIGS. 1, 11A, and 11B, the first resist pattern 171 may be removed to expose a top surface of the second seed layer 124p and the second conductive layer 126. For example, a top surface and a sidewall of the second conductive layer 126 may be exposed.

Figure 12A:
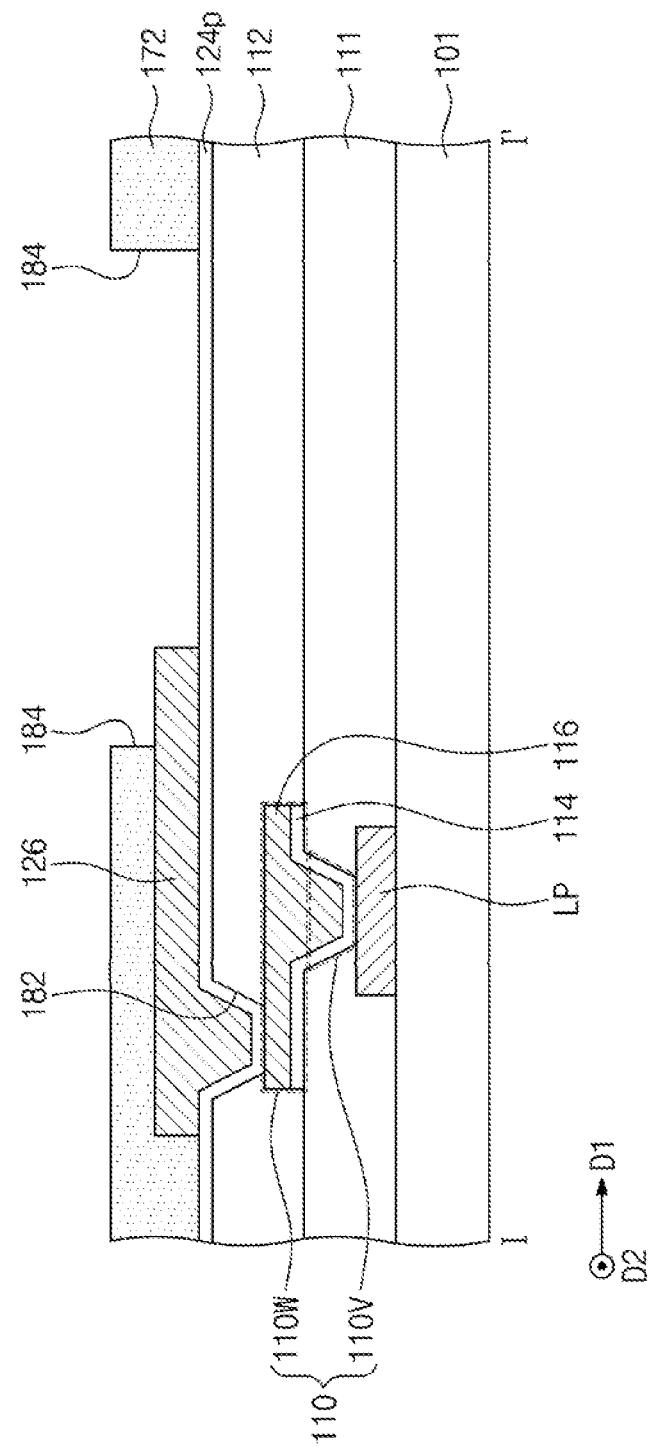
Figure 12B:
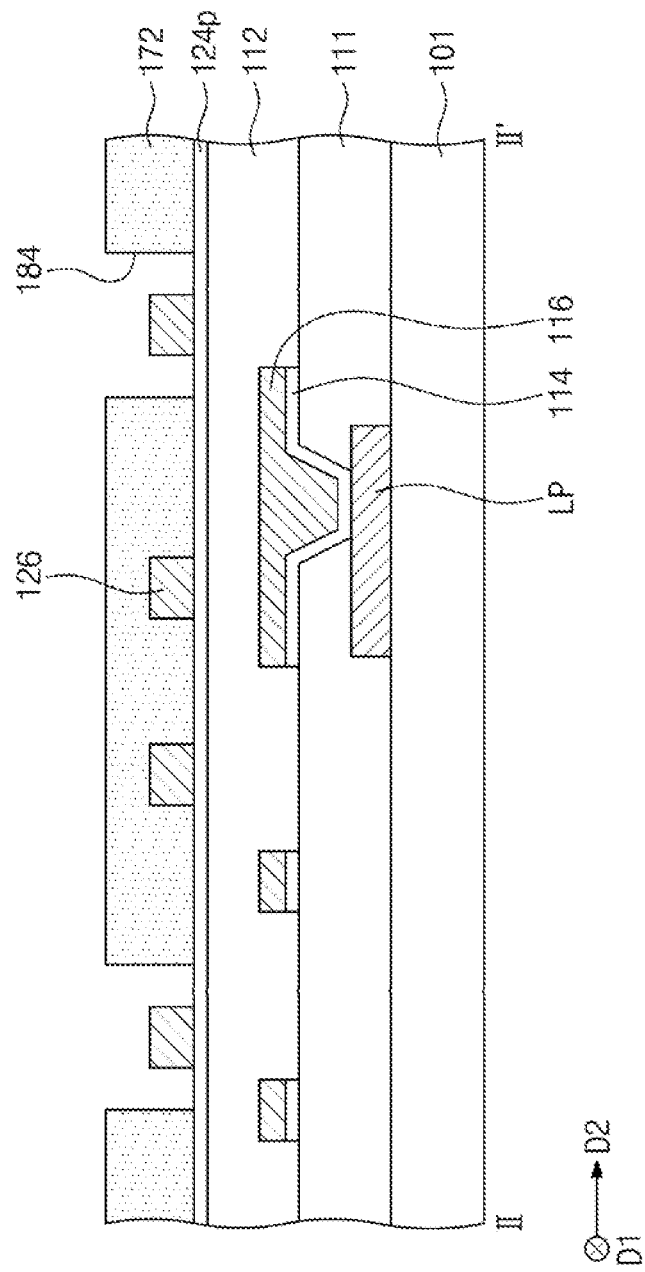

Referring to FIGS. 1, 12A and 12B, a second resist pattern 172 may be formed on the top surface of the second seed layer 124p and on lateral and top surfaces of the second conductive layer 126. The second resist pattern 172 may have a second trench 184. The second trench 184 may at least partially expose the top and lateral surfaces of the second conductive layer 126. In addition, the second trench 184 may at least partially expose the top surface of the second seed layer 124p adjacent to the second conductive layer 126. The second resist pattern 172 may include a photoresist material. The photoresist material may include an organic material, such as polymer.

Figure 13A:
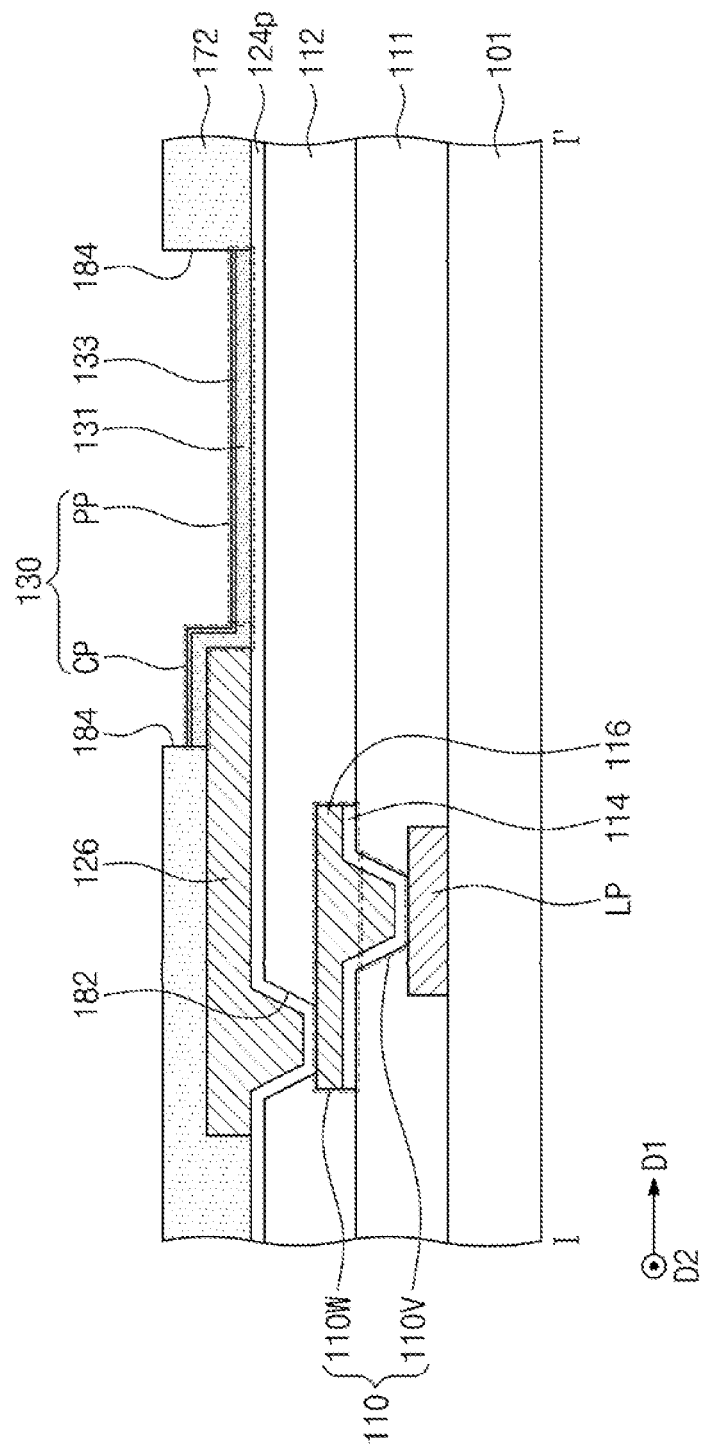
Figure 13B:
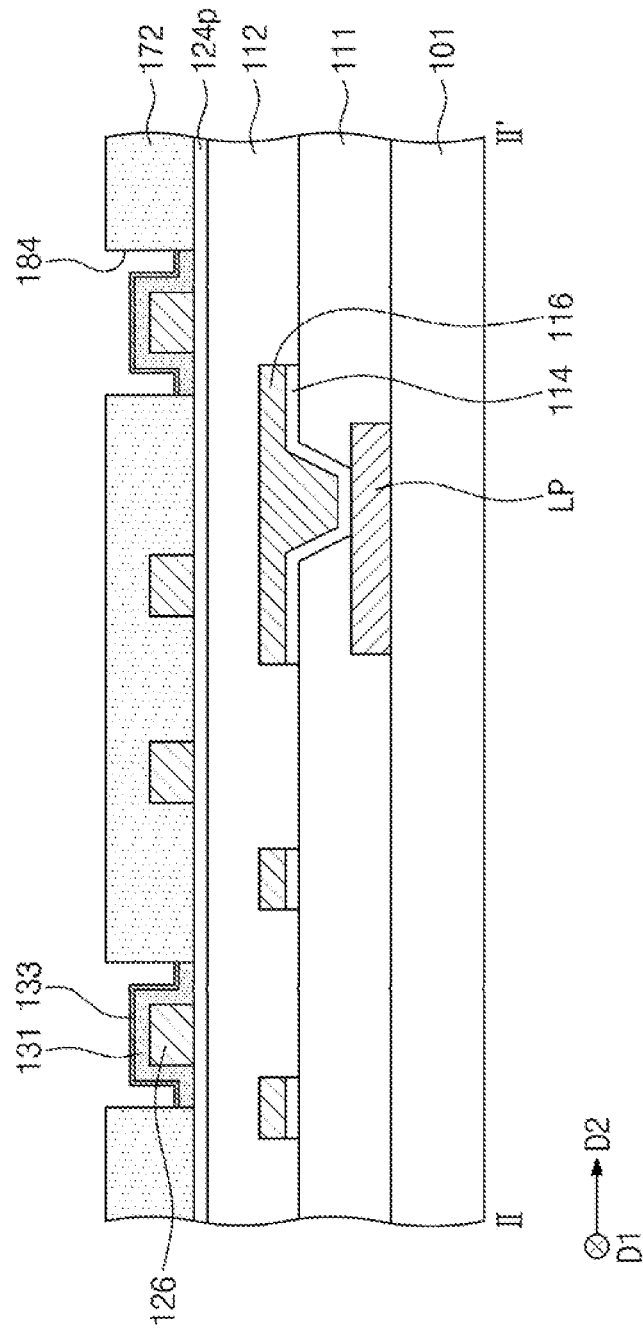

Referring to FIGS. 1, 13A, and 13B, a first metal layer 131 and a second metal layer 133 may be sequentially formed in the second trench 184. The formation of the first metal layer 131 may include performing an electroplating process in which the second conductive layer 126 and the second seed layer 124p are used as an electrode. The electroplating process may continue until the first metal layer 131 has a thickness of about 2 μm to about 8 μm. The first metal layer. 131 may include, for example, nickel (Ni).

Afterwards, an electroplating process may be performed in which the first metal layer 131 is used as an electrode, thereby forming the second metal layer 133 on the first metal layer 131. The electroplating process may continue until the second metal layer 133 has a thickness of about 0.1 μm to about 0.8 μm. The second metal layer 133 may include, for example, gold (An). As such, a pad pattern 130 may be formed which includes a connection part CP and an extension part PP.

Figure 14A:
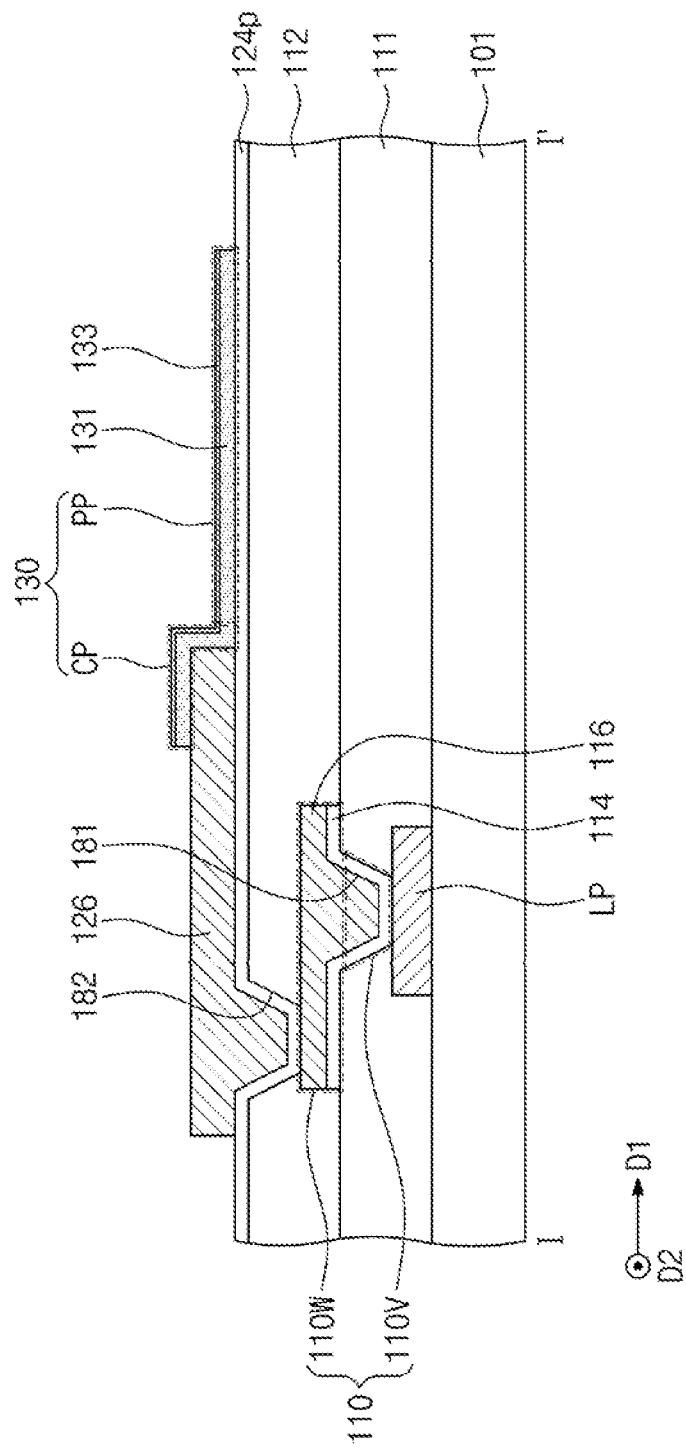
Figure 14B:
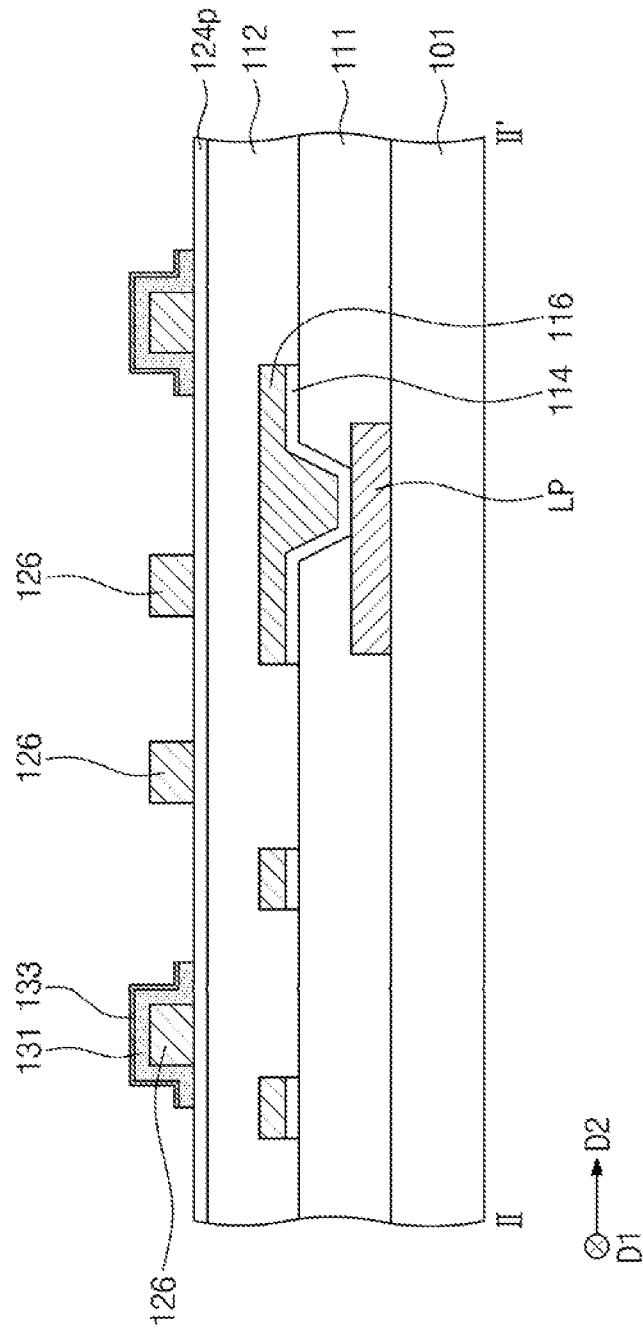

Referring to FIGS. 1, 14A, and 14B, the second resist pattern 172 may be removed to expose the top surface of the second seed layer 124p, the sidewalks of the second conductive layer 126, and surfaces of the second metal layer 133.

Referring back to FIGS. 1, 2A, and 2B, a passivation pattern 140 may be formed to cover the second dielectric layer 112, the second wiring pattern 120, and the pad pattern 130.

Before the formation of the passivation pattern 140, an exposed portion of the second seed layer 124p may be removed to expose the top surface of the second dielectric layer 112. The partial removal of the second seed layer 124p may be performed by an etch process. In the etch process, the second conductive layer 126 and the pad pattern 130 may have an etch selectivity with respect to the second seed layer 124p. The second seed layer 124p may have another portion below a bottom surface of the second conductive layer 126 and a bottom surface of the pad pattern 130, and that portion of the second seed layer 124p below the bottom surface of the second conductive layer 126 and the bottom surface of the pad pattern 130 may not be etched by the etch process. After the etch process, the remaining portion of the second seed layer 124p, below the bottom surface of the second conductive layer 126 and the bottom surface of the pad pattern 130, may be formed into a second seed pattern 124. Therefore, a second wiring pattern 120 may be formed which includes a second via part 120V and a second line part 120W.

The formation of the passivation pattern 140 may include coating an entire surface of the second dielectric layer 112 with a dielectric material to form a preliminary passivation dielectric layer, and patterning the preliminary passivation dielectric layer to form a pad opening H that at least partially exposes a top surface 130t of the extension part PP of the pad pattern 130. The preliminary passivation dielectric layer may include a photosensitive polymer as a photosensitive material. The photosensitive polymer may include, for example, one or more of photosensitive polyimide, polybenzoxazole, phenolic polymers, and/or benzocyclobutene polymers. Exposure and development processes may, be performed to pattern the preliminary passivation dielectric layer. The exposure process may be a negative tone exposure process or a positive tone exposure process.

Figure 15:
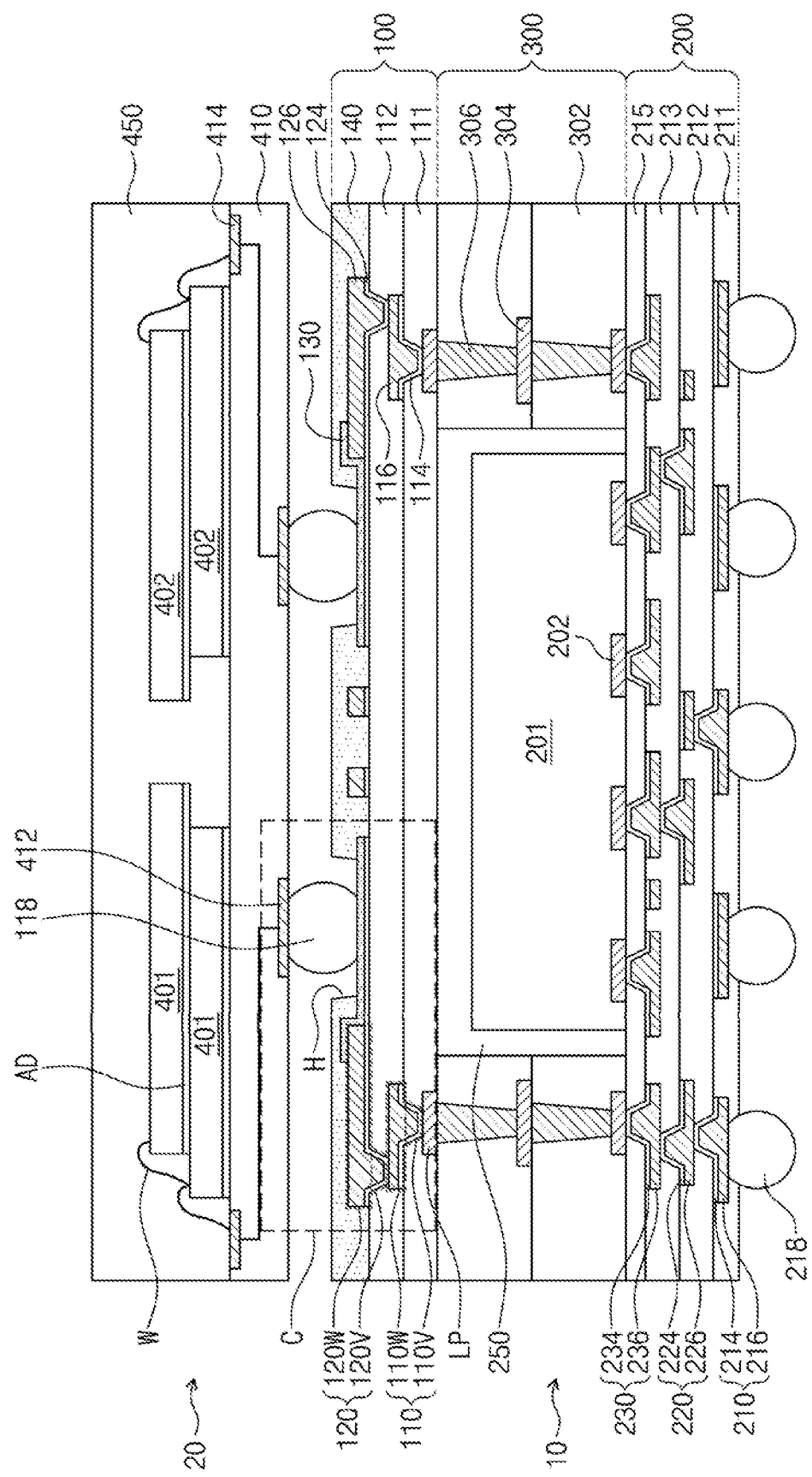
FIG. 15 illustrates a cross-sectional view showing a semiconductor package according to an exemplary embodiment of the present inventive concept.

FIG. 15 illustrates a cross-sectional view showing a semiconductor package according to an exemplary embodiment of the present inventive concept. FIG. 1 illustrates an enlarged cross-sectional view showing section C of FIG. 15. Omissions may be made to avoid repetitive detailed descriptions of duplicate components discussed above.

Figure 16:
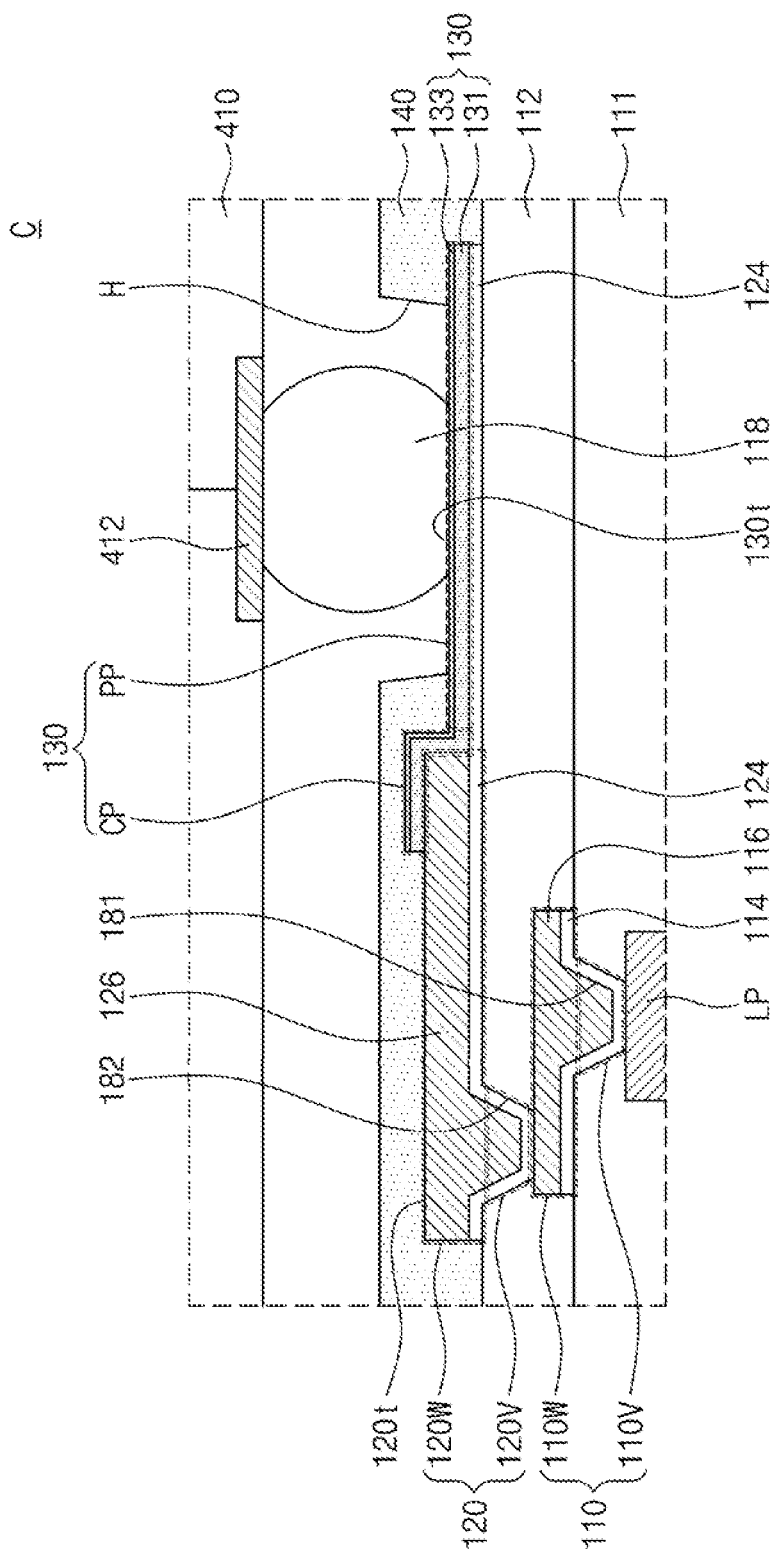
FIG. 16 illustrates an enlarged cross-sectional view, showing section C of FIG. 15.

Referring to FIGS. 15 and 16, a semiconductor package may include a lower package 10 and an upper package 20. For example, the semiconductor package may be a package-on-package (POP) in which the upper package 20 is mounted on the lower package 10.

The lower package 10 may include a lower redistribution structure 200, a first semiconductor chip 201 mounted on the lower redistribution structure 200, a first molding member 250 that lies on the lower redistribution structure 200 and covers the first semiconductor chip 201, and a redistribution structure 100 on the first molding member 250. In addition, the lower package 10 may include a connection substrate 300 between the lower redistribution structure 200 and the redistribution structure 100.

The lower redistribution structure 200 may include a first lower wiring pattern 210, a second lower wiring pattern 220, a third lower wiring pattern 230, lower dielectric layers 211, 212, 213, and 215, and external coupling terminals 218. The lower dielectric layers 211, 212, 213, and 215 may include a first lower dielectric layer 211, a second lower dielectric layer 212, a third lower dielectric layer 213, and a fourth lower dielectric layer 215 that are sequentially stacked.

The first, second, third, and fourth lower dielectric layers 211, 212, 213, and 215 may be stacked. For example, the first lower dielectric layer 211 may, include a different dielectric material from those of the second, third, and fourth lower dielectric layers 212, 213, and 215. The first lower dielectric layer 211 may include a dielectric polymer, such as an epoxy-based polymer. The first lower dielectric layer 211 may include, for example, an Ajinomoto build-up film (ABF). According to an exemplary, embodiment of the present inventive concept, the first lower dielectric layer 211 may include a photosensitive material. The photosensitive material may include, for example, a photo-imagable dielectric (PID). The second, third, and fourth lower dielectric layers 212, 213, and 215 may include an inorganic material, such as silicon oxide (SiOx), silicon nitride (SiNx), or silicon oxynitride (SiON).

A chip-first process may be performed to form the lower redistribution structure 200 on a bottom surface of the first semiconductor chip 201 and a bottom surface of the connection substrate 300. For example, the formation of the fourth lower dielectric layer 215 may be followed by the formations of the first, second, and third lower dielectric layers 211, 212, and 213. The third lower wiring pattern 230 may be formed on a bottom surface of the fourth lower dielectric layer 215. Thereafter, the third lower dielectric layer 213 and the second lower dielectric layer 212 may be sequentially formed. During the formation of the third and second lower dielectric layers 213 and 212, the second lower wiring pattern 220 and the first lower wiring pattern 210 may be formed. The first lower dielectric layer 211 may be formed to cover a bottom surface of the first lower wiring pattern 210. For example, the first lower wiring pattern 210 and the second lower wiring pattern 220 may be formed in the first lower dielectric layer 211 and the second lower dielectric layer 212, respectively.

A portion of the third lower wiring pattern 230 may penetrate the fourth lower dielectric layer 215 and may be coupled to a lower chip pad 202 of the first semiconductor chip 201. Another portion of the third lower wiring pattern 230 may penetrate the fourth lower dielectric layer 215 and may be coupled to a connection pad 304. The second lower wiring pattern 220 may be disposed on a bottom surface of the third lower dielectric layer 213. The second lower wiring pattern 220 may penetrate the third lower dielectric layer 213 and may be coupled to the third lower wiring pattern 230. The first lower wiring pattern 210 may be disposed on a bottom surface of the second lower dielectric layer 212. The first lower wiring pattern 210 may penetrate the second lower dielectric layer 212 and may be coupled to the second lower wiring pattern 220.

The first, second, and third lower wiring patterns 210, 220, and 230 may include their respective lower conductive layers 216, 226, and 236, and may also include their respective lower seed layers 214, 224, and 234 that cover upper surfaces of the lower conductive layers 216, 226, and 236, respectively. The lower conductive layers 216, 226, and 236 may include, for example, copper (Cu). The lower seed layers 215, 224, and 234 may include a conductive material that is used in an electroplating process to form the lower conductive layers 216, 226, and 236, respectively. The lower seed layers 214, 224, and 234 may include, for example, copper, titanium, or any alloy thereof. According to an exemplary embodiment of the present inventive concept, each of the lower seed layers 214, 224, and 234 may include the same material as that of its corresponding one of the lower, conductive layers 216, 226, and 236, and in this case, an indistinct interlace may be provided between each of the lower seed layers 214, 224, and 234 and its corresponding one of the lower conductive layers 216, 226, and 236.

The lower redistribution structure 200 may be provided thereon with a first molding member 250 that covers the first semiconductor chip 201. The first molding member 250 may cover lateral and top surfaces of the first semiconductor chip 201.

The connection substrate 300 may be disposed on the lower redistribution structure 200. The formation of the connection substrate 300 may be followed by or preceded by the formation of the first semiconductor chip 201. The connection substrate 300 may have a hole in which the first semiconductor chip 201 is provided. For example, the connection substrate 300 may be a printed circuit board, and the formation of the connection substrate 300 may include forming a hole that penetrates top and bottom surfaces of the printed circuit board. From a plan view, the hole may be formed, for example, on a central portion of the connection substrate 300. The connection substrate 300 may include base layers 302 and conductive structures 304 and 306. The base layers 302 may include a dielectric material. For example, the base layers 302 may include a carbon-based material, a ceramic, or a polymer. As an additional example, the base layers 302 may be multiple layers stacked. The conductive structures 304 and 306 may include connection pads 304 and, connection vias 306. The connection vias 306 may vertically penetrate the base layers 302 and may be coupled to the connection pads 304. The conductive structures 304 and 306 may provide electrical paths between the lower redistribution structure 200 and the redistribution structure 100.

The redistribution structure 100 may be provided on a top surface of the connection substrate 300 and a top surface of the first molding member 250. The redistribution structure 100 may include a lower pad LP, a first wiring pattern 110, a second wiring pattern 120, a pad pattern 130, dielectric layers 111 and 112, and a passivation pattern 140. The dielectric layers 111 and 112 may include first and second dielectric layers 111 and 112 that are sequentially stacked. A detailed configuration of the redistribution structure 100 may be the same as or similar to that discussed with reference to FIGS. 1 to 14B. The lower pad LP of the redistribution structure 100 may be electrically connected to the conductive structures 304 and 306 of the connection substrate 300. For example, the lower pad LP may be electrically connected to the connection vias 306.

A connection terminal 118 may be provided on the pad pattern 130. The connection terminal 118 may be positioned on a top surface of the extension part PP of the pad pattern 130. In addition, the connection terminal 118 may be positioned in the pad opening H of the passivation pattern 140 and the pad opening H at least partially exposes the top surface of the extension part PP. The connection terminal 118 may have a bottom surface at a vertical level lower than that of the top surface 120t of the second wiring pattern 120. The connection terminal 118 may include one or more of solders, pillars, and/or bumps. The connection terminal 118 may include a conductive material, such as a solder material. The solder material may include, for example, tin, bismuth, lead, silver, or any alloy thereof.

The upper package 20 may be disposed on the lower package 10. The upper package 20 may include a package substrate 410, upper semiconductor chips 301 and 402, and an upper molding layer 450. The package substrate 410 may include a lower metal pad 412, and the lower metal pad 412 may be exposed on a bottom surface of the package substrate 410. For example, the package substrate 410 may be a printed circuit board. For another example, the package substrate 410 may be a redistribution layer.

The upper semiconductor chips 401 and 402 may be disposed on the package substrate 410. The upper semiconductor chips 401 and 402 may include first upper semiconductor chips 401 and second upper semiconductor chips 402 that are stacked through adhesive layers AD on a top surface of the package substrate 410. For example, the first upper semiconductor chips 401 and 402 may be fixed to the package substrate 410 and each other through the adhesive layers AD. Each of the upper semiconductor chips 401 and 402 may include integrated circuits, and the integrated circuits may include, for example, a memory circuit, a logic circuit, and a combination thereof. The upper semiconductor chips 401 and 402 may include semiconductor chips that may be of different types from the first semiconductor chip 201. According to an exemplary embodiment of the present inventive concept, the first semiconductor chip 201 may be an application processor (AP) chip, and the upper semiconductor chips 401 and 402 may be memory chips. The upper semiconductor chips 401 and 402 may be electrically connected to upper metal pads 414 of the package substrate 410 through wires W.

The package substrate 410 may be provided thereon with the upper molding layer 450 that covers the upper semiconductor chips 401 and 402. The upper molding layer 450 may include a dielectric polymer, such as an epoxy-based polymer.

Figure 17:
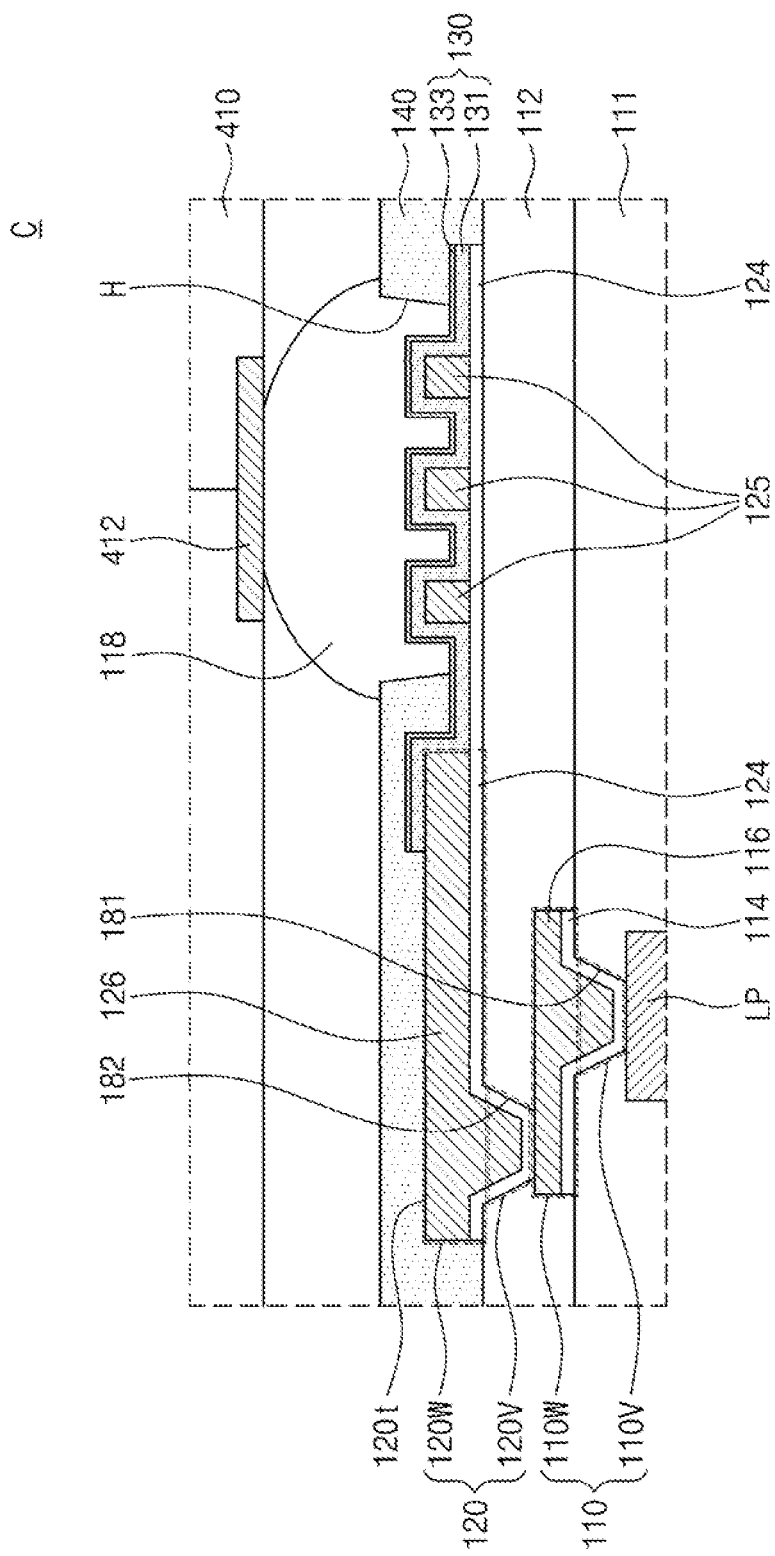
FIG. 17 illustrates an enlarged cross-sectional view showing section C of FIG. 15.

FIG. 17 illustrates an enlarged cross-sectional view showing section D of FIG. 15. Omissions may be made to avoid repetitive descriptions about duplicate components.

Referring to FIGS. 15 and 17, the redistribution structure 100 may further include conductive protrusions 125 between the second seed pattern 124 and the first metal layer 131 of the pad pattern 130. The pad pattern 130 may conformally cover lateral and top suffices of the conductive protrusions 125. For example, each of the conductive protrusions 125 may be separated from each other and inner sides of the pad opening H, and may be disposed in the pad opening H of the passivation pattern 140.

The connection terminal 118 may cover a top surface of the second metal layer 133 in the pad opening H. The top surface of the second metal layer 133 may be uneven, and thus the bottom surface of the connection terminal 118 may also be uneven. Therefore, a contact area may be increased between the second metal layer 133 and the connection terminal 118, and a contact resistance may be reduced between the second metal layer 133 and the connection terminal 118. The connection terminal 118 may fill the pad opening H of the passivation pattern 140. The connection terminal 118 may have a lowermost surface at a vertical level lower than that of the top surface 1201 of the second wiring pattern 120.

Figure 18:
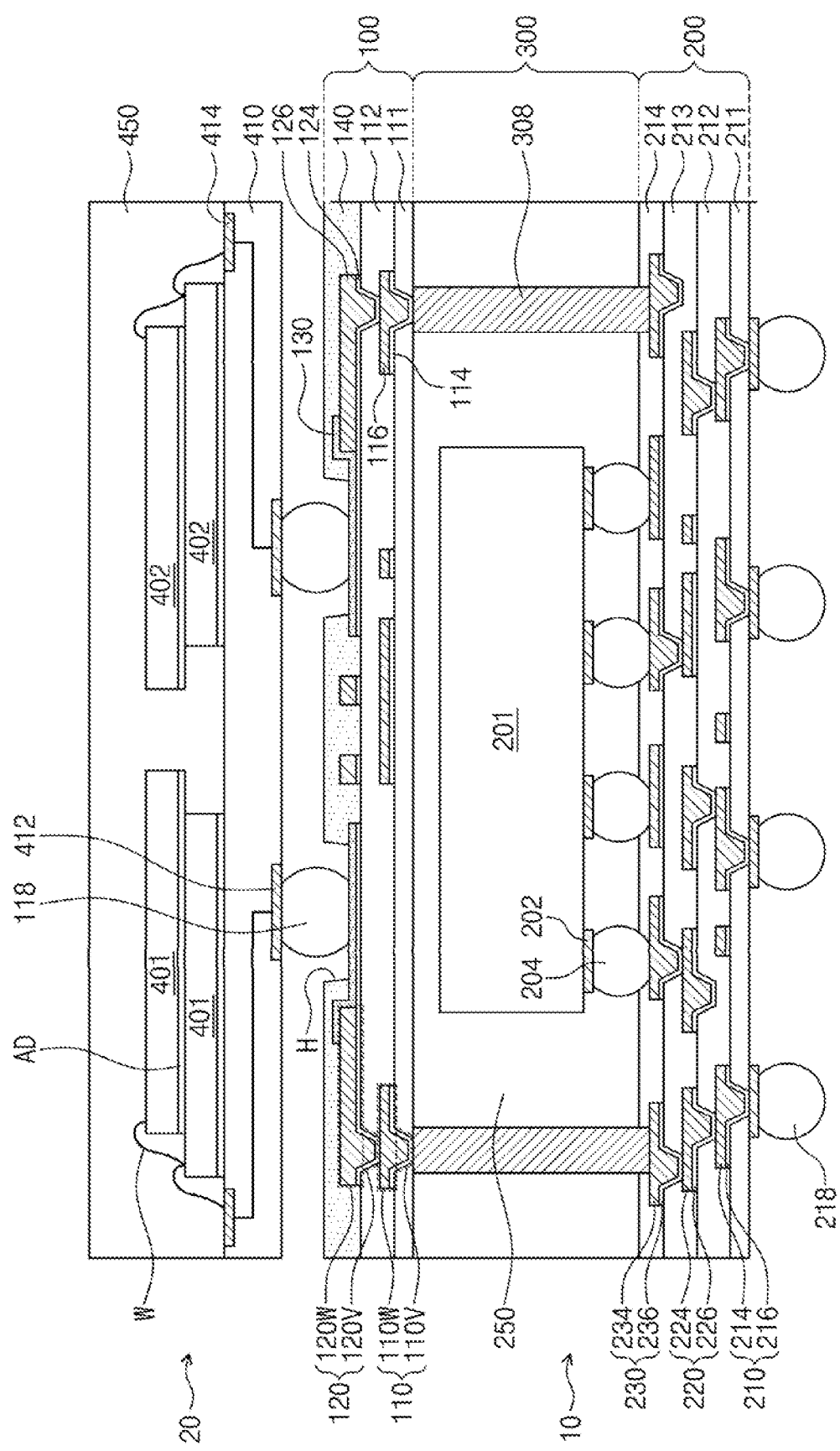
FIG. 18 illustrates a cross-sectional view showing a semiconductor package according to an exemplary embodiment of the present inventive concept.

FIG. 18 illustrates a cross-sectional view showing a semiconductor package according to an exemplary embodiment of the present inventive concept. The following description will focus on differences from the components discussed above, and omissions may be made to avoid repetitive explanations of duplicate components.

Referring to FIG. 18, the connection substrate 300 may include a first molding member 250 and a conductive via 308.

The lower redistribution structure 200 may be provided on the first molding member 250 that covers the first semiconductor chip 201. The first molding member 250 may cover lateral surfaces, a top surface, and at least a portion of a bottom surface of the first semiconductor chip 201. The first molding member 250 may cover a top surface of the lower redistribution structure 200. The first molding member 250 may have a width the same as that of the lower redistribution structure 200. For example, the first molding member 250 may have a sidewall aligned with that of the lower redistribution structure 200.

A conductive via 308 that penetrates the first molding member 250 may be provided between the lower redistribution structure 200 and the redistribution structure 100. The conductive via 308 may electrically connect the lower redistribution structure 200 to the redistribution structure 100. The conductive via 308 may have a columnar shape and may include metal such as copper. The conductive via 308 may have a top surface connected to a bottom surface of the first wiring pattern 110 and may also have a bottom surface connected to a top surface of the third lower wiring pattern 230.

The first semiconductor chip 201 may be electrically connected to the lower redistribution structure 200 through a lower connection terminal 204. The lower connection terminal 204 may be interposed between the third lower wiring pattern 230 and the lower chip pad 202, and may electrically connect the first semiconductor chip 201 to the lower redistribution structure 200.

According to an exemplary embodiment of the present inventive concept, a semiconductor package which may have a relatively high integration of wiring lines in a redistribution layer, an increased accuracy of alignment between conductive structures on the redistribution layer, and a relatively easy fabrication process, may be provided.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. A semiconductor package, comprising:
   a first wiring pattern;
   a dielectric layer that covers the first wiring pattern;
   a second wiring pattern on the dielectric layer, wherein the second wiring pattern includes a line part that extends in a first direction and a via part that connects the line part to the first wiring pattern;
   a pad pattern electrically connected to the second wiring pattern, wherein the pad pattern includes a connection part and an extension part, wherein the connection part covers a portion of a first surface of the line part of the second wiring pattern, and the extension part has a top surface at a level lower than a level of a top surface of the line part of the second wiring pattern; and
   a seed pattern between the extension part and the dielectric layer,
   wherein a lower surface of a conductive layer of the line part of the second wiring pattern is coplanar with a lower surface of the extension part.

2. The semiconductor package of claim 1, wherein the pad pattern has a thickness greater than a thickness of the seed pattern and less than a thickness of the line part of the second wiring pattern.

3. The semiconductor package of claim 1, wherein the pad pattern has a thickness about 1.5 times to about 1.0 times a thickness of the seed pattern.

4. The semiconductor package of claim 1, wherein the line part of the second wiring pattern has a thickness about 2 times to about 5 times a thickness of the pad pattern.

5. The semiconductor package of claim 1, wherein the extension part contacts the seed pattern.

6. The semiconductor package of claim 1, further comprising a passivation pattern that covers top surfaces of the second wiring pattern and the connection part of the pad pattern,
   wherein the passivation pattern includes a material different from a material of the dielectric layer.

7. The semiconductor package of claim 1, further comprising a passivation pattern that covers top surfaces of the second wiring pattern and the connection part of the pad pattern,
   wherein the passivation pattern has a pad opening that exposes at least a portion of the top surface of the extension part of the pad pattern.

8. The semiconductor package of claim 1, further comprising an upper package that has a connection terminal and a pad, wherein the connection terminal is disposed on the extension part, and the pad is coupled to the connection terminal.

9. The semiconductor package of claim 1, wherein the pad pattern includes a first metal layer and a second metal layer that includes a material different from a material of the first metal layer.

10. The semiconductor package of claim 1, wherein
    the pad pattern includes a first metal layer and a second metal layer on the first metal layer, and
    the first metal layer has a thickness greater than a thickness of the second metal layer.

11. The semiconductor package of claim 1, wherein
    the connection part of the pad pattern and the extension part of the pad pattern are adjacent to each other in a first direction, and
    a width in a second direction of the connection part of the pad pattern is less than a width in the second direction of the extension part of the pad pattern, wherein the second direction is substantially perpendicular to the first direction.

12. A semiconductor package, comprising:
    a lower redistribution structure;

a first semiconductor chip on the lower redistribution structure;
a dielectric layer on the first semiconductor chip;
a first wiring pattern in the dielectric layer;
a second wiring pattern on the dielectric layer, wherein the second wiring pattern includes a line part that extends in a first direction and a via part that connects the line part to the first wiring pattern;
a pad pattern electrically connected to the second wiring pattern, wherein the pad pattern includes a connection part and an extension part, wherein the connection part covers a portion of a top surface of the line part of the second wiring pattern, and the extension part has a top surface at a level lower than a level of the top surface of the line part of the second wiring pattern;
a passivation pattern that covers the second wiring pattern and the connection part of the pad pattern, wherein the passivation pattern has a pad opening that exposes at least a portion the extension part of the pad pattern;
a seed pattern between the pad pattern and the dielectric layer;
a connection terminal in the pad opening overlapping a portion of the extension part of the pad pattern; and
a second semiconductor chip on the connection terminal and electrically connected to the lower redistribution structure through the connection terminal,
wherein a portion of a conductive layer of the line part of the second wiring pattern is disposed between the seed pattern and the connection part of the pad pattern.

13. The semiconductor package of claim 12, further comprising a conductive structure that electrically connects the first wiring pattern to the lower redistribution structure.

14. The semiconductor package of claim 12, wherein the pad pattern has a thickness greater than a thickness of the seed pattern and less than a thickness of the second wiring pattern.

15. The semiconductor package of claim 12, wherein the passivation pattern includes a material different from a material of the dielectric layer.

16. The semiconductor package of claim 12, wherein a bottom surface of the connection terminal is located at a vertical level lower than a vertical level of a top surface of the second wiring pattern.

17. A semiconductor package, comprising:
a first wiring pattern;
a dielectric layer that covers the first wiring pattern;
a second wiring pattern on the dielectric layer, wherein the second wiring pattern including a line part that extends in a first direction and a via part that connects the line part to the first wiring pattern; and
a pad pattern electrically connected to the second wiring pattern, wherein the pad pattern includes an extension part and a connection part, wherein the extension part has a width greater than a width of the line part, and the connection part connects the extension part to the line part,
wherein the connection part covers a portion of a top surface and a lateral surface of the line part of the second wiring pattern.

18. The semiconductor package of claim 17, wherein the extension part has a top surface at a level lower than a level of the top surface of the line part of the second wiring pattern.

19. The semiconductor package of claim 17, Wherein the pad pattern has a thickness greater than a thickness of a seed pattern disposed on the dielectric layer and less than a thickness of the second wiring pattern.

20. The semiconductor package of claim 17, wherein a bottom surface of the extension part contacts a top surface of a seed pattern disposed on the dielectric layer.

* * * * *